United States Patent [19]

Hirzel et al.

[11] Patent Number: 4,606,052
[45] Date of Patent: Aug. 12, 1986

[54] METHOD FOR DETECTION OF LINE ACTIVITY FOR MANCHESTER-ENCODED SIGNALS

[75] Inventors: Frederic J. Hirzel, Cupertino, Calif.; Roy J. Levy, Ashland, Oreg.

[73] Assignee: Advanced Micro Devices, Inc., Sunnyvale, Calif.

[21] Appl. No.: 684,085

[22] Filed: Dec. 21, 1984

[51] Int. Cl.[4] .................. H03K 5/153; H03M 5/12
[52] U.S. Cl. .......................... 375/87; 375/55; 307/360; 360/44
[58] Field of Search .............. 375/87, 55, 95, 10; 307/360; 360/42, 44

[56] References Cited

U.S. PATENT DOCUMENTS 3,836,956  9/1974  Cross ............................ 375/87
4,142,065  2/1979  Tannhauser ..................... 375/55

Primary Examiner—Marc E. Bookbinder
Assistant Examiner—Andrew J. Telesz, Jr.
Attorney, Agent, or Firm—Patrick T. King; Kenneth B. Salomon

[57] ABSTRACT

A signal pre-processing method for detecting valid Manchester-encoded activity on a line carrying Manchester-encoded data signals to an inexpensive Manchester-decoding receiver. Detection is provided by monitoring both a positive-level presence and a negative-level presence to determine whether the received Manchester-encoded signal exceeds a predetermined positive voltage or falls below a predetermined negative voltage. Following detection of such line activity, the received signal is determined to be validly Manchester-encoded if it first crosses a predetermined positive level or a predetermined negative level after having first previously crossed the opposite level within a time interval of $\frac{3}{4}$ to $1\frac{1}{4}$ of the inter-bit period of the received data signals.

5 Claims, 13 Drawing Figures

METHOD FOR DETECTION OF LINE ACTIVITY FOR MANCHESTER-ENCODED SIGNALS

CROSS-REFERENCE TO RELATED APPLICATION

Related copending application of particular interest to this invention is application Ser. No. 684,919, filed Dec. 21, 1984, on behalf of Roy Levy and Frederic J. Hirzel entitled "A Method for Digital Clock Recovery from Manchester-Encoded Signals," assigned to the assignee of the instant application.

FIELD OF THE INVENTION

This invention relates to decoding receivers for Manchester-encoded signals and, in particular, to methods for detecting the presence of a Manchester-encoded signal received on a data communication signalling line.

BACKGROUND OF THE INVENTION

The proliferation of localized data-processing and data-handling equipment has spurred provision of data signal communication via inexpensive communication links between these various equipments linked together to form local area network systems. Serial transmission of data on only one inexpensive signal line such as a twisted pair of wires or a coaxial cable is a cost-effective way of linking data equipment into a local area network.

Data signals sent on signal lines are subject to distortion and electrical interference, in the form of impulse noise and the like. Recovery of data information from a distorted and noisy transmitted data signal by a receiver requires the use of a local clock signal at the receiver. Providing a separate clock signal at the receiver site which is synchronous with the transmitted data is a significant problem. Transmitting a separate clock signal on a separate line is an expensive solution. Conventional non-return-to-zero (NRZ) data signals usually contain a direct-current dc component, which is particularly strong on long strings of ONEs or ZEROs. For NRZ data signals, the dc component must be propagated through the signal line. It should be appreciated that transmission of a data signal through an alternating-current (ac) coupled signal line is desirable and that providing for direct-current (dc) coupling of a data signal is an expensive undertaking.

Manchester-encoding of a data signal prior to transmission overcomes the above mentioned problems of transmitting a separate clock signal and of providing dc coupling for the data signal.

A Manchester-encoded data signal solves these problems by being a so-called self-clocking signal and by having no dc component. In simplest form, a Manchester-encoded signal can be thought of as being generated by combining the data signal with the clock signal. The combination is then transmitted through an ac-coupled transmission medium.

To generate a Manchester-encoded signal an NRZ data signal and a square wave clock signal are combined in an EXCLUSIVE-OR gate to produce a Manchester-encoded signal having a 50-50 duty cycle. For one-half of a bit period, the Manchester-encoded signal is at a ONE binary level, and for the other half of the bit period, the Manchester-encoded signal is at its complementary binary level. Consequently, no dc component is produced and Manchester-encoded signals, having no dc component, are well suited for transmission through ac coupled systems.

From the above, it should be recognized, that for each bit period of a Manchester-encoded signal, a transition from a binary ZERO to a binary ONE, or vice-versa, must occur. This doubles the transmission bandwidth required for a Manchester-encoded transmission system but provides significant advantages, as described above. For a square-wave clock, the transition occurs at the middle of the bit cell, or bit period. Depending upon the phase of the clock signal in a bit period, the transition from a ZERO to a ONE level represents either a ONE data bit or ZERO data bit. Similarly, the transition from a ONE to a ZERO level represents the opposite type of data bit. Because the Manchester-encoded data signal always has a transition occurring at the middle of a bit period, a clock signal can, in principle, be recovered at a receiver.

However, distortion and noise on a received Manchester-encoded signal make detection of data transitions and subsequent reconstruction of a received clock signal difficult because a receiver cannot distinguish between a valid Manchester-encoded signal and noise. This situation is particularly troublesome when a signal line has been in an idle state with no signals on the line and when a valid Manchester-encoded signal is subsequently sent. A receiver which cannot adequately distinguish noise signals from the start of the sequence of valid Manchester-encoded signals is unable to begin to properly recover the clock signal and ultimately to provide a synchronized clock signal for subsequent recovery of Manchester-encoded data signals. Thus, it should be appreciated that recovery and synchronization of clock signal for a Manchester-encoded data receiver are critical functions.

The problems of synchronization of a receiver clock and recognition of valid Manchester-encoded signal activity on a signalling line, have been addressed with a number of system solutions. For example, systems which operate in conformity with MIL-STD 1553 use a so-called synchronizing impulse data string which precedes valid data. The synchronizing impulse, of course, can be sent on a separate signal line, but obviously, that is an undesirable solution.

Another example of an attempt to provide a correct indication of line activity in conjunction with a rather sophisticated and somewhat expensive dc-coupled distributed data is a network transmission system called ETHERNET, which uses a unipolar signal format. It provides a noise filter function at its input such that input signals which are less than 30 nanoseconds duration or which are less than minus 150 millivolts in amplitude are rejected. The first pulse which is greater than 50 nanoseconds duration and which is more negative than −250 millivolts activates the receiver. The receiver is deactivated if a second such negative pulse does not occur within 160 nanoseconds of the first pulse.

SUMMARY OF THE INVENTION

Accordingly, an object of the invention is to provide a method for detecting the presence of Manchester-encoded signals on a signal line which readily distinguishes between valid Manchester-encoded signal and noise, and can be implemented in an inexpensive Manchester-encoded receiver.

In accordance with the invention, a method for detecting presence of a valid Manchester-encoded signal on a signal line is provided. This includes positive level-presence detection which provides a signal indicating that the level of received Manchester-encoded signal is greater than a predetermined positive level. Similarly negative level-presence detection provides a signal indicating that the Manchester-encoded signal is less than a predetermined negative level. Advanced-presence detection is provided by monitoring both the positive level-presence signal and the negative-presence signal indicating activity on the signal lines by providing an advance-presence signal in response to receipt of either a positive level output signal or a negative-level output signal. The positive level and negative level-presence signals are monitored to provide a line-acquisition signal under the conditions that a received Manchester-encoded signal first crosses a predetermined positive or a predetermined negative level after having first previously crossed the opposite level to thereby indicate the presence of Manchester-encoded signal line. Both the advanced-presence signal and the line-acquisition signal are combined to act as the signal pre-processing method in a Manchester-encoded receiver.

BRIEF DESCRIPTION OF THE DRAWINGS

The accompanying drawings which are incorporated into and form a part of the specification, illustrate the invention and, together with the description, serve to explain the principles of the invention.

In the Drawings.

DETAILED DESCRIPTION OF THE PREFERRED EMBODIMENT

Reference is now made in detail to the present preferred embodiment of the invention which illustrates the best mode presently contemplated by the inventor for practicing the method and apparatus of the invention, the preferred embodiment of which is illustrated in the accompanying drawings.

The invention described herein is the Receiver portion of a single integrated circuit identified as the Advanced Micro Devices Am7960 Coded Data Transceiver.

A. Receiver Channel Interface Circuit

Figure 1:
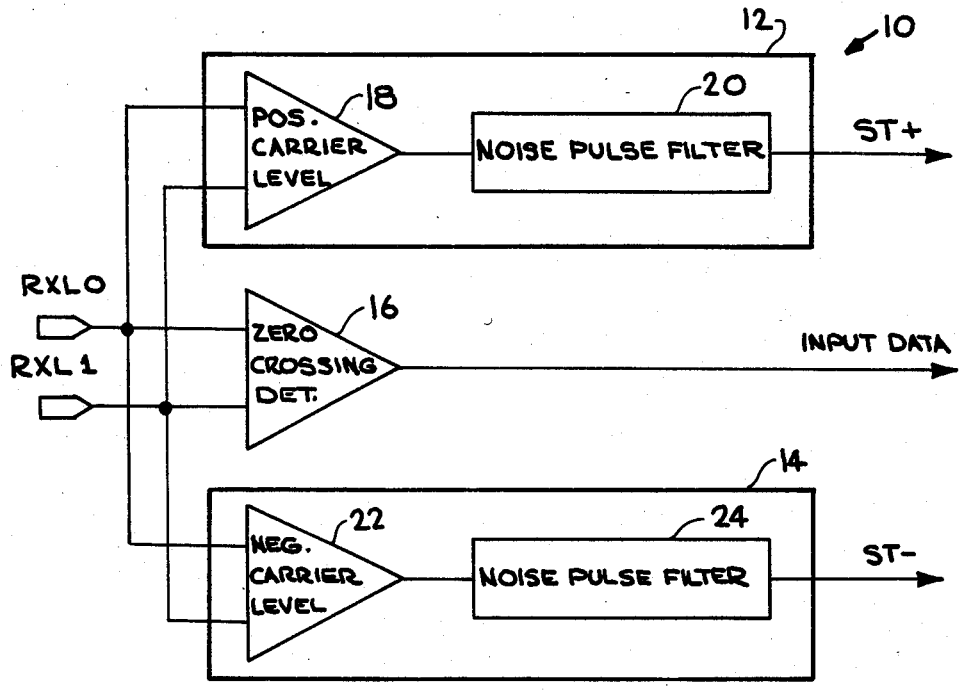
FIG. 1 is a functional diagram of a receiver channel interface circuit.
Figure 2A:
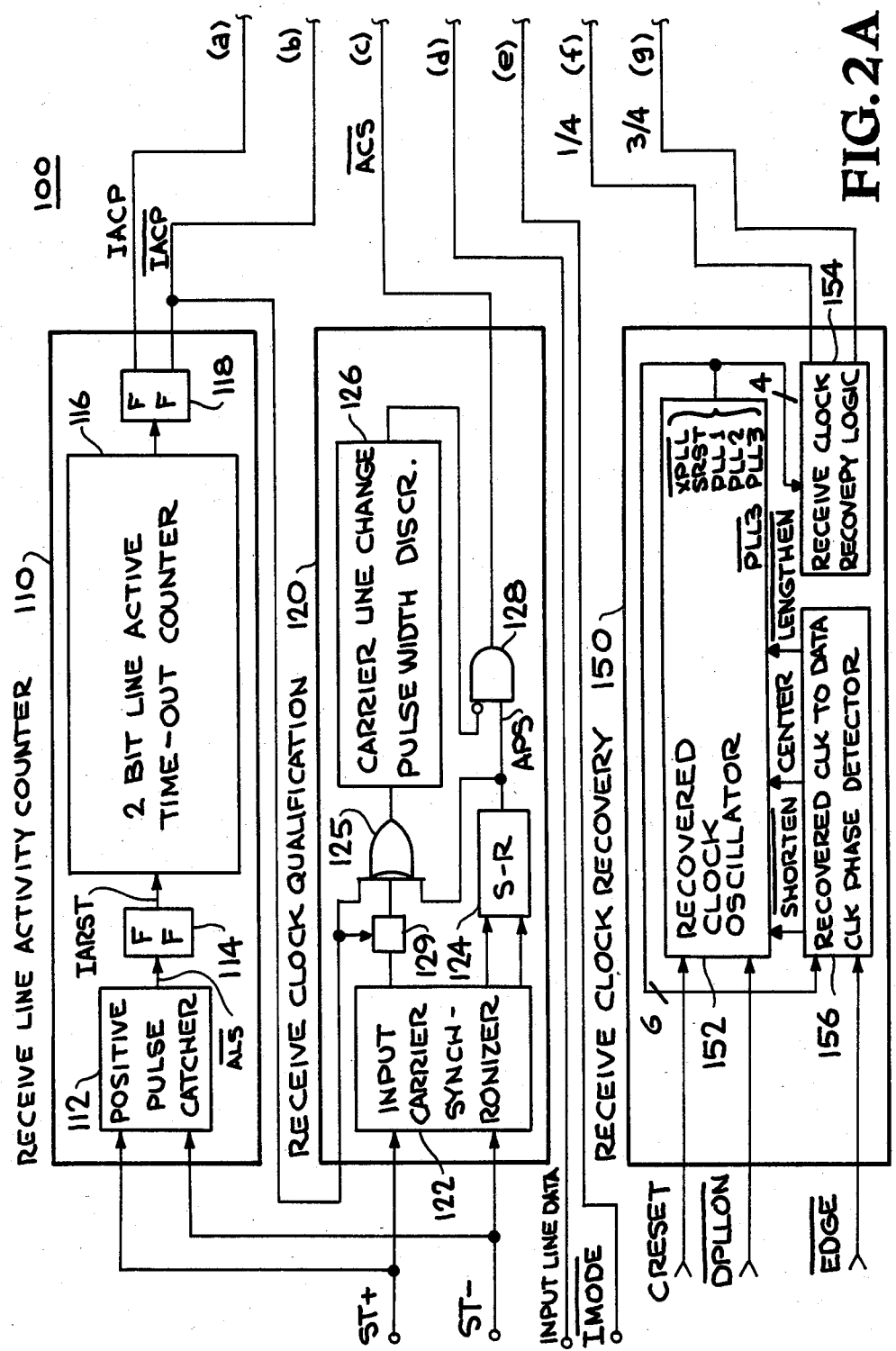
FIGS. 2A and 2B are a functional block diagram of a Manchester-encoded Receiver according to the present invention.

Referring to FIG. 1 of the drawings, a Receiver channel interface 10 circuit is illustrated which permits connection of the Receiver of the instant invention, illustrated in FIG. 2, for example, to a twisted-pair of signal lines via an isolation transformer (not shown). The channel interface circuit includes a positive carrier presence detector 12, a negative carrier presence detector 14, and a zero-crossing detector 16, each of which receive Manchester-encoded signals conducted via the isolation transformer to a pair of Receiver line input terminals RxL0 and RxL1. As the received signals are Manchester-encoded, the alternating current (ac)-coupling provided by the transformer to the input terminals of the Receiver channel interface circuit 10 is permissible because of the lack of dc bias, as mentioned in the Background of the Invention, above.

Figure 3:
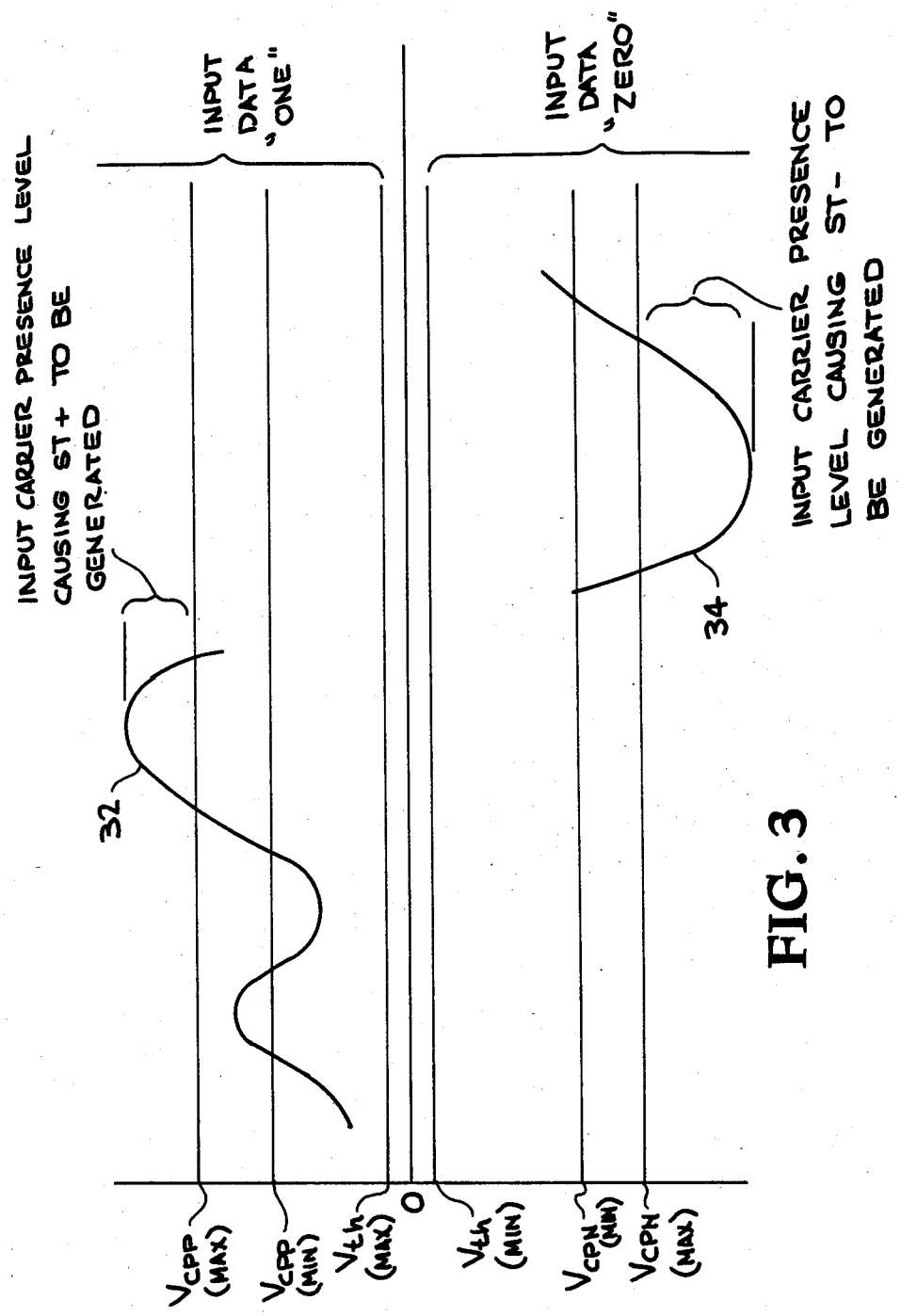
FIG. 3 illustrates the operation of the receiver interface circuit of FIG. 1.

As illustrated in FIG. 3, the channel interface circuit 10 translates the signals received at the RxL0 and RxL1 terminals into a positive sequence threshold (ST+) signal or a negative sequence threshold (ST−) signal, by conventional circuitry comprising a positive carrier level comparator 18 and noise pulse filter 20, and a negative carrier level comparator 22 and noise pulse filter 24, respectively.

The positive carrier level comparator 18 and negative carrier level comparator 22 receive the signals present at the input terminals RxL0 and RxL1 and produce output signals if the corresponding differential input signal is above, or below, respectively, predetermined differential voltage levels internal to comparator 18, comparator 22, respectively.

As illustrated in the upper waveform 32 of FIG. 3, a positive signal received at the RxL0, RxL1 terminals of receiver channel interface 10 will cause the ST+ signal to be generated if the signal has a differential voltage above the Vcpp(max), it will not generate ST+ if level is below Vcpp(min).

As illustrated in the lower half of FIG. 3, a negative signal received at the RxL0, RxL1 terminals will cause the ST− signal to be generated if the signal has a differential voltage below Vcpn(max), it will not generate the ST− signal if the level is above Vcpn(min).

A signal received at the RxL0, RxL1 terminals of receiver channel interface circuit 10 with a differential voltage above Vth(max) will cause an input data signal of ONE to be generated by zero-crossing detector 16, and a received signal with a differential voltage below Vth(min) will cause an input data signal of ZERO to be generated by zero-crossing detector 16.

The noise pulse filters 20 and 24 are conventional in design and are inserted at the outputs of positive carrier level comparator 18 and negative carrier level comparator 22, respectively, to filter out radio-frequency (RF) noise in the signals ST+, ST−, respectively, generated at their respective outputs.

B. Terminal Characteristics of the Manchester-encoded Receiver

FIG. 2 is a functional block diagram of a Manchester-encoded Receiver 100 according to the present invention.

The Receiver 100 illustrated in FIG. 2 provides a modem-like interface between a communication controller and the receiver channel interface 10, of FIG. 1.

As shown in FIG. 2, the ST+, ST− signals generated by the receiver channel interface 10 are applied to a Receive Line Activity Counter block 110 of Receiver 100. As the instant invention concerns the method and apparatus for detecting activity on the signal line connected to the RxL0 and RxL1 terminals of the receiver channel interface 10, as performed within blocks 110, 120 and 130 only a cursory description of the remaining three functional blocks illustrated in FIG. 2 comprising Receiver 100 will be given hereinafter.

For a detailed description of blocks 140 and 150, reference should be had to the related copending application Ser. No. 684,919, filed Dec. 21, 1984, on behalf of Roy Levy and Frederick Hirzel entitled "A Method for Digital Clock Recovery from Manchester-encoded Signals", which is hereby incorporated by reference.

Figure 4:
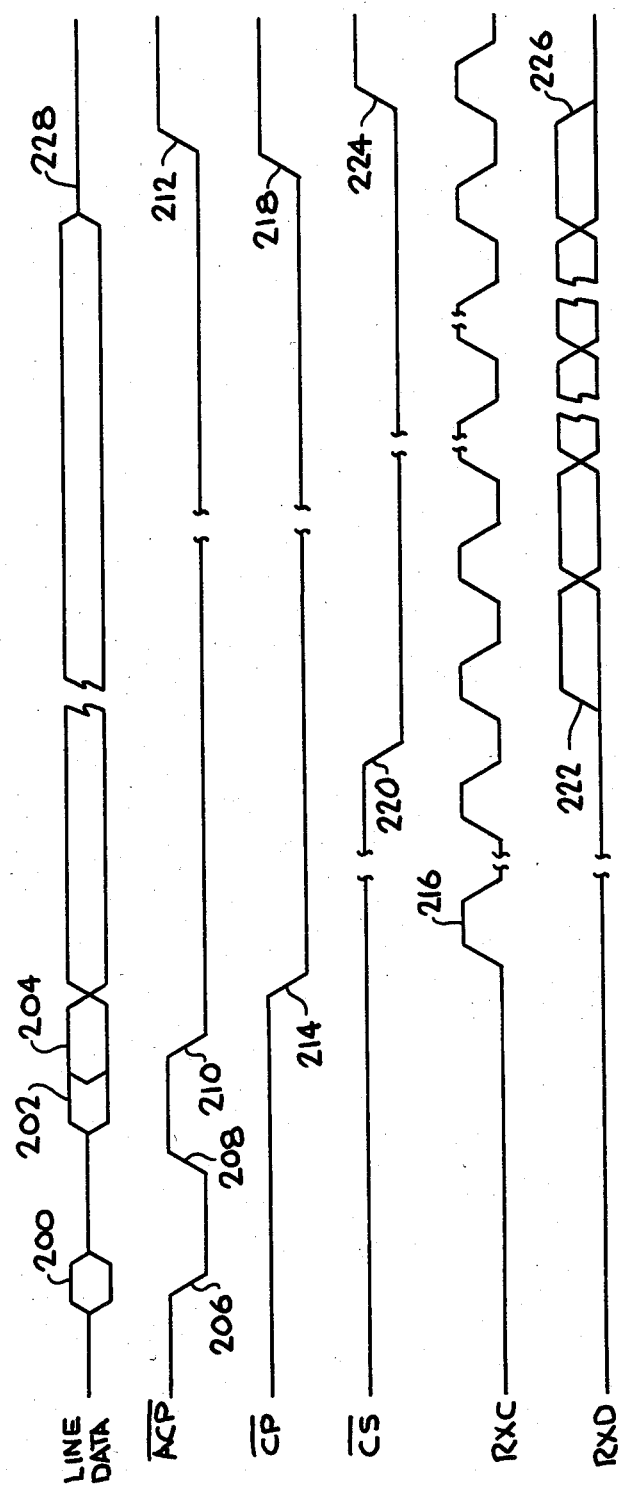
FIG. 4 is a timing diagram of the terminal characteristics of the Manchester-encoded Receiver according to the present invention.

The ST+ and ST−, and the input LINE DATA signals generated by the receiver channel interface 10 are applied to a Receive Clock Qualification block 120 and a Receive Data Interpreter and Supervisor block 130, respectively of Receiver 100. As shown in FIG. 4, status signals are generated at an advance carrier presence ($\overline{APC}$), a carrier presence ($\overline{CP}$) and a carrier sense ($\overline{CS}$), terminal of Receiver 100 and signals are generated at a receive clock (RxC) and a receive data (RxD) terminals thereof in response to the ST+, ST− and LINE DATA signals applied thereto. Internal counterparts, preceded by the letter "I", for these signals are used synonymously hereinafter, for instance IACP is used to represent the internal advance carrier presence signal.

As shown on FIG. 4, after the Receiver 100 has detected line activity 200 at the RxL0, RxL1 terminals of the Receiver, it attempts to acquire information from the line data to generate the signals at the RxC terminal. This so-called "Clock Qualification" takes place within block 120 and is achieved by sampling the presence levels ST+ and ST−. With reference to FIG. 3, there must be a differential line voltage signal applied to the RxL0 and RxL1 terminals either above the positive presence level Vcpp(max) and then below the negative presence level Vcpn(max) or below the negative presence level Vcpn(max) and then above the positive presence level Vcpn(max), in ¾ to 1¼ the inter-bit time of the input LINE DATA. After this occurs, the next detected line activity 202, causes Receiver 100 to initiate acquisition of the receive clock recovery circuitry 150, 204, as shown in FIG. 4.

In response to detection of the transitions of the LINE DATA signals, "line activity" 200, the Receiver 100 causes the signal at the $\overline{ACP}$ terminal to become active, 206 and 210, as shown on the second waveform of FIG. 4. The signal at the $\overline{ACP}$ terminal is inactivated after there has been no line activity detected for 2 inter-bit times, 208, or end of message is detected, 212.

The Receiver 100 causes the signal at the $\overline{CP}$ terminal to become active after the receive clock recovery circuit 150 has acquired internal clocking 214 and immediately before the signal at the receive clock (RxC) terminal is initiated, 216. The signal at the $\overline{CP}$ terminal is inactivated as is the case with the signal at the $\overline{ACP}$ terminal as described above, 218.

As shown on the fourth waveform of FIG. 4, the Receiver 100 causes the signal at the $\overline{CS}$ terminal to become active 220 when received and decoded date is to be generated at the RxD terminal of the Receiver 100, 222. The signal at the $\overline{CS}$ terminal remains active until either there has been no line activity detected for 2 inter-bit times 224, or the line data is detected to be other than valid Manchester-encoded. The signals at the RxD terminal will continue to be generated until $\overline{CP}$ becomes inactive, 226.

The Receiver 100 decodes the input data by sampling within block 130 at ¼- and ¾-bit intervals following the start of the inter-bit time. If these samples are of opposite binary polarity, valid Manchester-encoded data has been decoded. If these samples are of the same binary polarity as is the sample at the next ¼-bit interval, the Receiver 100 determines that an end-of-message has been detected, 228.

C. Logic Circuits of the Receiver

The six functional blocks of Receiver 100, blocks 110, 120, 150, 130, 140 and 160 consist of the components illustrated in the logic diagrams of FIGS. 6, 7, 8, 9, 10 and 11, respectively. A brief description of the circuits shown on these logic diagrams will now be given.

Figure 6:
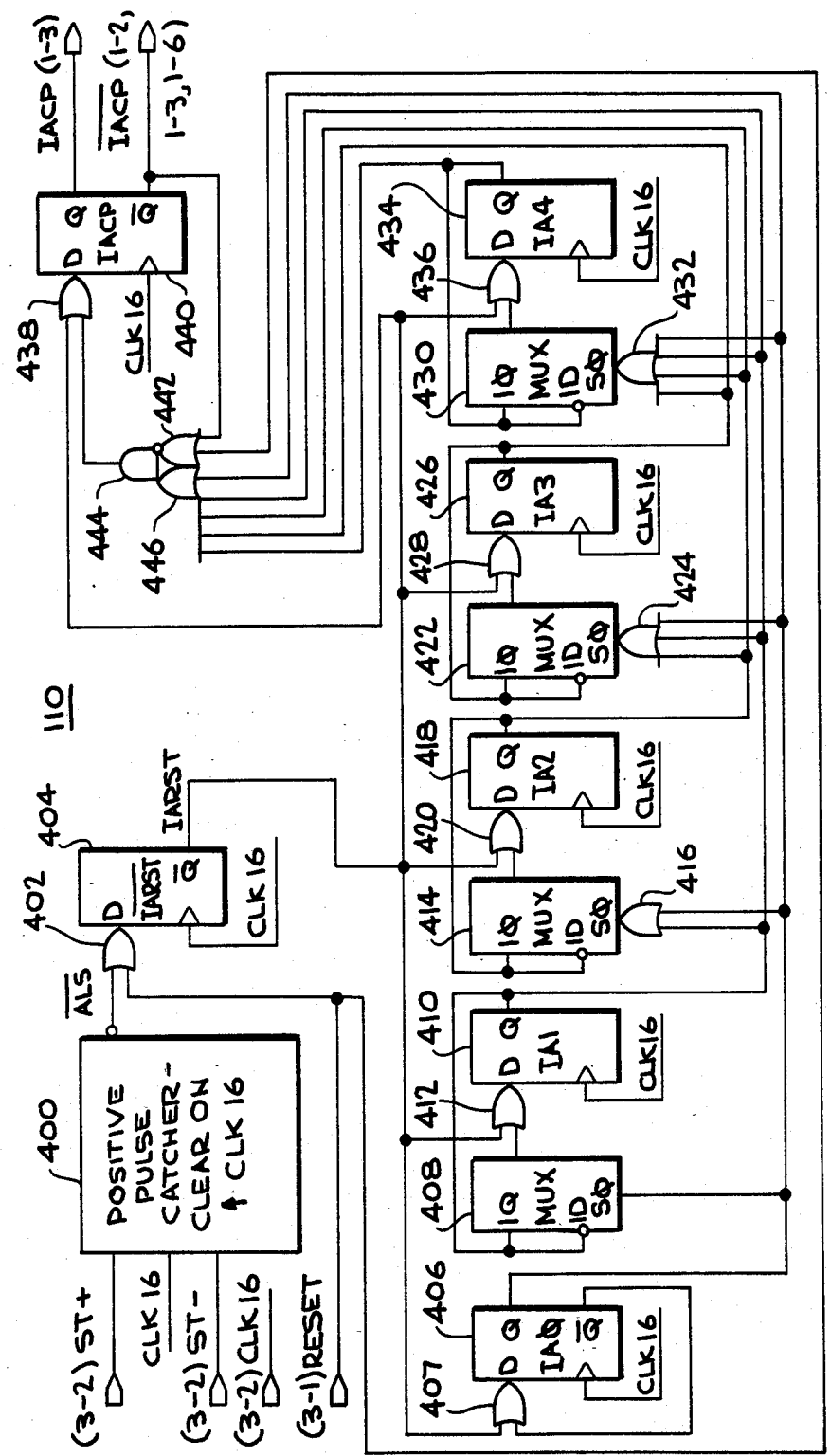
FIG. 6 is a logic diagram of the Receive Line Activity Counter section of the Receiver of the present invention.

With reference to FIG. 6, the Receive Line Activity Counter block 110 includes a positive pulse catcher 400 (112 on FIG. 2A) which receives the ST+ and ST− signals generated by receiver channel interface 10 and a clock signal (CLK16) from a clock internal to block 110 (not shown) with a cycle sixteen times faster than that of the clock signal recovered from the LINE DATA signals.

An advanced line signal (ALS) is generated by pulse catcher 400 when either ST+ or ST− signal has been conducted to the pulse catcher and on the rising edge of the CLK16 signal, the complemented ALS signal is conducted to a first input of an OR gate 402. A second input of OR gate 42 receives a RESET signal conducted from a terminal of Receicer 100. A D-type flip-flop 404 (114 on FIG. 2A) receives at its data input (D) the output signal generated by OR gate 402. Flip-flop 404 also receives the CLK16 signal at its clock input. Flip-flop 404 generates at its complemented output terminal ($\overline{Q}$) an input line activity reset (IARST) signal.

As shown on FIG. 6, the IARST signal is conducted to a 2-bit line active time-out counter portion of block 110 (116 on FIG. 2A), which includes five D-type flip-flops and four multiplexers. A D-type flip-flop 406 receives at its data input (D) the signal generated by an OR gate 407 which, in turn, receives at a first input the IARST signal generated by flip-flop 404. A second input of OR gate 407 receives the signal generated at the complemented output terminal ($\overline{Q}$) of flip-flop 406. Flip-flop 406 also receives the CLK16 signal at its clock input.

A two-in, one-out multiplexer (MUX) 408 receives at a control input (S0) the signal generated at the output terminal (Q) of flip-flop 406, which signal is used by the MUX 408 to select which of the signals applied to MUX 408 at a 1Q or a complemented 1D terminal will be generated at an output of MUX 408.

A second D-type flip-flop 410 receives at its data input (D) the signal generated by an OR gate 412 which, in turn, receives at a first input the IARST signal generated by flip-flop 404. A second input of OR gate 412 receives the signal generated at the output terminal of MUX 408. Flip-flop 410 also receives the CLK16 signal at its clock input. A second two-in, one-out multiplexer (MUX) 414 receives at a control input (S0) the signal generated by an OR gate 416 which, in turn, receives at a first input the signal generated at the output terminal (Q) of flip-flop 410, which signal is also conducted to true (1Q) and complemented (1D) inputs of MUX 408. A second input of OR gate 416 receives the signal generated at the complemented output terminal ($\overline{Q}$) of flip-flop 406. The control signal is used by the MUX 414 to select which of the signals applied to MUX 414 at a 1Q or a complemented 1D terminal will be generated at an output of MUX 414.

A third D-type flip-flop 418 receives at its data input (D) the signal generated by an OR gate 420 which, in turn, receives at a first input the IARST signal generated by flip-flop 404. A second input of OR gate 420 receives the signal generated at the output terminal of MUX 414. Flip-flop 418 also receives the CLK16 signal at its clock input. A third two-in, one-out multiplexer (MUX) 422 receives at a control input (S0) the signal generated by an OR gate 424 which, in turn, receives at a first input the signal generated at the output terminal (Q) of flip-flop 410. A second input of OR gate 424 receives the signal generated at the complemented output terminal ($\overline{Q}$) of flip-flop 406, and a third input of OR gate 424 receives the signal generated at the output terminal (Q) of flip-flop 418, which signal is also conducted to true (1Q) and complemented (1D) inputs of MUX 414. The control signal is used by the MUX 422 to select which of the signals applied to MUX 422 at a 1Q or a complemented 1D terminal will be generated at an output of MUX 414.

A fourth D-type flip-flop 426 receives at its data input (D) the signal generated by an OR gate 428 which, in turn, receives at a first input the IARST signal generated by flip-flop 404. A second input of OR gate 420 receives the signal generated at the output terminal of MUX 422. Flip-flop 418 also receives the CLK16 signal at its clock input. A fourth two-in, one-out multiplexer (MUX) 430 receives at a control input (S0) the signal generated by an OR gate 432 which, in turn, receives at a first input the signal generated at the output terminal (Q) of flip-flop 410. A second input of OR gate 432 receives the signal generated at the complemented output terminal ($\overline{Q}$) of flip-flop 406, a third input of OR gate 432 receives the signal generated at the output terminal (Q) of flip-flop 418, and a fourth input of OR gate 432 receives the signal generated at the output terminal (Q) of flip-flop 426, which signal is also conducted to true (1Q) and complemented (1D) inputs of MUX 422. The control signal is used by the MUX 430 to select which of the signals applied to MUX 430 at a 1Q or a complemented 1D terminal will be generated at an output of MUX 430.

A fifth D-type flip-flop 434 receives at its data input (D) the signal generated by an OR gate 436 which, in turn, receives at a first input the IARST signal generated by flip-flop 404. A second input of OR gate 434 receives the signal generated at the output terminal of MUX 430. Flip-flop 434 also receives the CLK16 signal at its clock input. The signal generated at the output terminal (Q) of flip-flop 434 is conducted to true (1Q) and complemented (1D) inputs of MUX 430 as well as to a first input of an OR gate 438.

The signal generated at the output terminal of OR gate 438 is conducted to a data input (D) of a D-type flip-flop 440 (118 on FIG. 2A), which generates at its true output terminal (Q) an internal advance carrier presence (IACP) signal which indicates line activity, and generates at its complement output terminal ($\overline{Q}$) the complement of the IACP signal, $\overline{IACP}$. The $\overline{IACP}$ signal so generated is conducted to a first input to a NOR gate 442, which receives at a second input the signal generated at the complemented output terminal of flip-flop 406. The signal generated by NOR gate 442 is received at a first input of an AND gate 444, which, in turn, has its output terminal connected to a second input terminal of the OR gate 438. An OR gate 446 receives the signals generated at the complemented output terminal of flip-flop 406 and the true output terminal of flip-flops 410, 418, 426 and 434. The signal generated by OR gate 446 is received at a second input terminal of AND gate 444. Flip-flop 440 also receives the CLK16 signal at its clock input.

Figure 7:
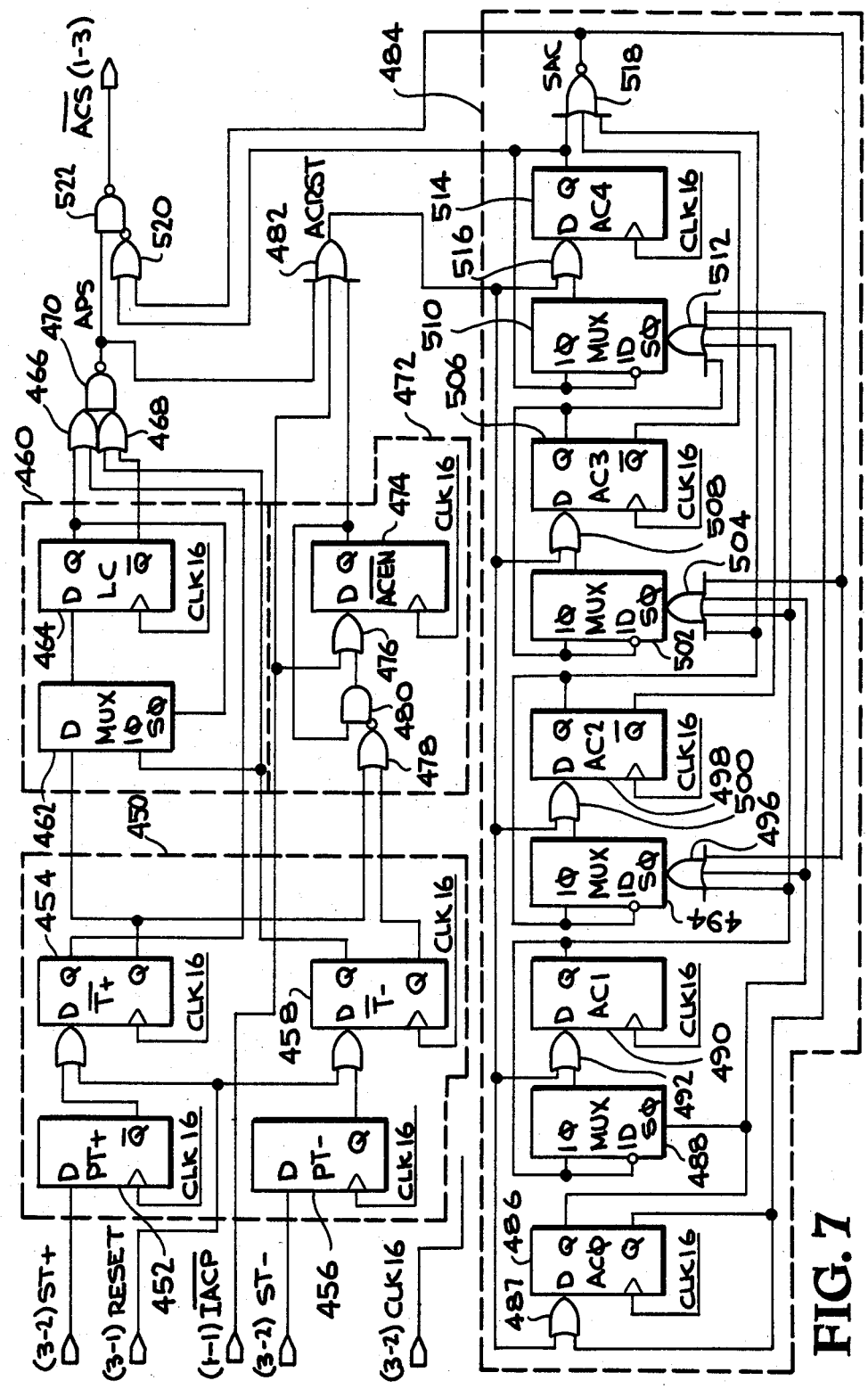
FIG. 7 is a logic diagram of the Receive Clock Qualification section of the Receiver of the present invention.

With reference to FIG. 7, the Receive Clock Qualification block 120 includes an input carrier synchronizer section 450 (122 on FIG. 2A) which receives the ST+ and ST− signals generated by receiver channel interface 10 and a clock signal (CLK16) from a clock internal to block 110 (not shown) with a cycle sixteen times faster than that of the clock signal recovered from the LINE DATA signals. The input carrier synchronizer section 450 includes four D-type flip-flops 452, 454, 456 and 458 which each receive the CLK16 clock signal at their clock inputs. The ST+ signal is applied to the data input (D) terminal of flip-flop 452, which is connected in series with flip-flop 454 to provide double-buffering of the ST+ signal. The ST− signal is applied to the data input (D) terminal of flip-flop 456, which is connected in series with flip-flop 458 to provide double-buffering of the ST− signal. The individually synchronized signals ST+, $\overline{ST+}$, ST−, $\overline{ST-}$ are conducted to a 2-bit clocked shift register (S-R)460 (124 on FIG. 2A) which includes a two-in, one-out multiplexer (MUX) 462 which receives at a control input (S0) the signal generated at the true output terminal of a D-type flip-flop 464 included in S-R 460. The control signal is used by the MUX 462 to select which of the signals applied to MUX 462 at a 1Q (the signal generated at the true output terminal of flip-flop 458) or a 1D terminal (the signal generated at the complemented output terminal of flip-flop 454) will be generated at an output of MUX 464. Flip-flop 464 receives at its data input terminal (D) the signal generated at output terminal of MUX 462, and the CLK16 signal at its clock input terminal. The 2-clock-cycle-delayed signal generated at the true (Q), and complemented ($\overline{Q}$), output terminals of flip-flop 464 are conducted to logic circuitry consisting of a pair of OR gates 466, and 468, respectively, and the signals generated thereby are received by an AND gate 470. OR gates 466 and 468 also receive the signals generated at the true output terminals of flip-flops 454 and 458, respectively. An activity presence sense (APS) signal is generated at a complemented output of AND gate 470.

A register portion 472 of block 120 (129 on FIG. 2A) includes a D-type flip-flop 474 which receives at its data input (D) a signal generated by an OR gate 476, which in turn receives at a first input terminal the $\overline{IACP}$ signal generated by flip-flop 440 (FIG. 6). An NOR gate 478 receives the output signal generated at the true, and complemented, output terminals of flip-flop 454 and 458, respectively. The signal generated at an output terminal of NOR gate 478 is conducted to a first input terminal of an AND gate 480, which generates a signal conducted to a second input terminal of OR gate 476. A second input terminal of AND gate 480 receives the signal generated at the true output terminal (Q) of flip-flop 474. Flip-flop 474 receives the CLK16 signal at its clock input terminal.

An OR gate 482 (125 on FIG. 2A) receives the APS, $\overline{IACP}$ and the signal generated at the true output terminal of flip-flop 474 and generates therefrom an advanced carrier reset (ACRST) signal which is conducted to a carrier line change pulse width discriminator section 484 (126 on FIG. 2A) of block 120.

As shown on FIG. 7, the ACRST signal is conducted to a 5-bit counter portion of discriminator 484 (126 on FIG. 2A), which includes five D-type flip-flops and four multiplexers. A D-type flip-flop 486 receives at its data input (D) the signal generated by an OR gate 487 which, in turn, receives at a first input the ACRST signal generated by OR gate 482. A second input of OR gate 487 receives the signal generated at the complemented output terminal ($\overline{Q}$) of flip-flop 486. Flip-flop 486 also receives the CLK16 signal at its clock input. A two-in, one-out multiplexer (MUX) 488 receives at a control input (S0) the signal generated at the output terminal (Q) of flip-flop 486, which signal is used by the MUX 488 to select which of the signals applied to MUX 488 at a 1Q or a complemented 1D terminal will be generated at an output of MUX 488.

A second D-type flip-flop 490 receives at its data input (D) the signal generated by an OR gate 492 which, in turn, receives at a first input the ACRST signal generated by OR gate 482. A second input of OR gate 492 receives the signal generated at the output terminal of MUX 488. Flip-flop 490 also receives the CLK16 signal at its clock input. A second two-in, one-out multiplexer (MUX) 494 receives at a control input (S0) the signal generated by an OR gate 496 which, in turn, receives at a first input the signal generated at the output terminal (Q) of flip-flop 490, which signal is also conducted to true (1Q) and complemented (1D) inputs of MUX 488. A second input of OR gate 496 receives the signal generated at the complemented output terminal ($\overline{Q}$) of flip-flop 486. The control signal is used by the MUX 494 to select which of the signals applied to MUX 494 at a 1Q or a complemented 1D terminal will be generated at an output of MUX 494.

A third D-type flip-flop 498 receives at its data input (D) the signal generated by an OR gate 500 which, in turn, receives at a first input the ACRST signal generated by OR gate 482. A second input of OR gate 500 receives the signal generated at the output terminal of MUX 494. Flip-flop 498 also receives the CLK16 signal at its clock input. A third two-in, one-out multiplexer (MUX) 502 receives at a control input (S0) the signal generated by an OR gate 504 which, in turn, receives at a first input the signal generated at the output terminal (Q) of flip-flop 490. A second input of OR gate 504 receives the signal generated at the complemented output terminal ($\overline{Q}$) of flip-flop 486, and a third input of OR gate 504 receives the signal generated at the output terminal (Q) of flip-flop 498, which signal is also conducted to true (1Q) and complemented (1D) inputs of MUX 494. The control signal is used by the MUX 502 to select which of the signals applied to MUX 502 at a 1Q or a complemented 1D terminal will be generated at an output of MUX 502.

A fourth D-type flip-flop 506 receives at its data input (D) the signal generated by an OR gate 508 which, in turn, receives at a first input the ACRST signal generated by OR gate 482. A second input of OR gate 508 receives the signal generated at the output terminal of MUX 502. Flip-flop 506 also receives the CLK16 signal at its clock input. A fourth two-in, one-out multiplexer (MUX) 510 receives at a control input (S0) the signal generated by an OR gate 512 which, in turn, receives at a first input the signal generated at the complemented output terminal ($\overline{Q}$) of flip-flop 498. A second input of OR gate 512 receives the signal generated at the complemented output terminal ($\overline{Q}$) of flip-flop 486, a third input of OR gate 432 receives the signal generated at the complemented output terminal ($\overline{Q}$) of flip-flop 498, and a fourth input of OR gate 512 receives the signal generated at the output terminal (Q) of flip-flop 506, which signal is also conducted to true (1Q) and complemented (1D) inputs of MUX 502. The control signal is used by the MUX 510 to select which of the signals applied to MUX 510 at a 1Q or a complemented 1D terminal will be generated at an output of MUX 510.

A fifth D-type flip-flop 514 receives at its data input (D) the signal generated by an OR gate 516 which, in turn, receives at a first input the ACRST signal generated by OR gate 482. A second input of OR gate 516 receives the signal generated at the output terminal of MUX 510. Flip-flop 514 also receives the CLK16 signal at its clock input. The signal generated at the output terminal (Q) of flip-flop 514 is conducted to true (1Q) and complemented (1D) inputs of MUX 510 as well as to a first input of a NOR gate 518. NOR gate 518 receives at a second input terminal the signal generated at the complemented ($\overline{Q}$) output terminal of flip-flop 506 and at a third input terminal the signal generated at the true (Q) output terminal of flip-flop 498. The signal generated at the output terminal of NOR gate 518 is conducted to a third input terminal of OR gate 496 and to a fourth input terminal of OR gate 504 as well as to a first input terminal of an OR gate 520. The signal generated at the true (Q) output terminal of flip-flop 514 is received at a second input terminal of OR gate 520.

The signal generated at the output terminal of OR gate 520 is conducted to a complemented input terminal of an AND gate 522 (128 On FIG. 2A) and the APS signal generated by NAND gate 470 is received at a true input terminal of AND gate 522, which generates at a complemented output terminal an advanced carrier sense ($\overline{ACS}$) signal therefrom.

Figure 8:
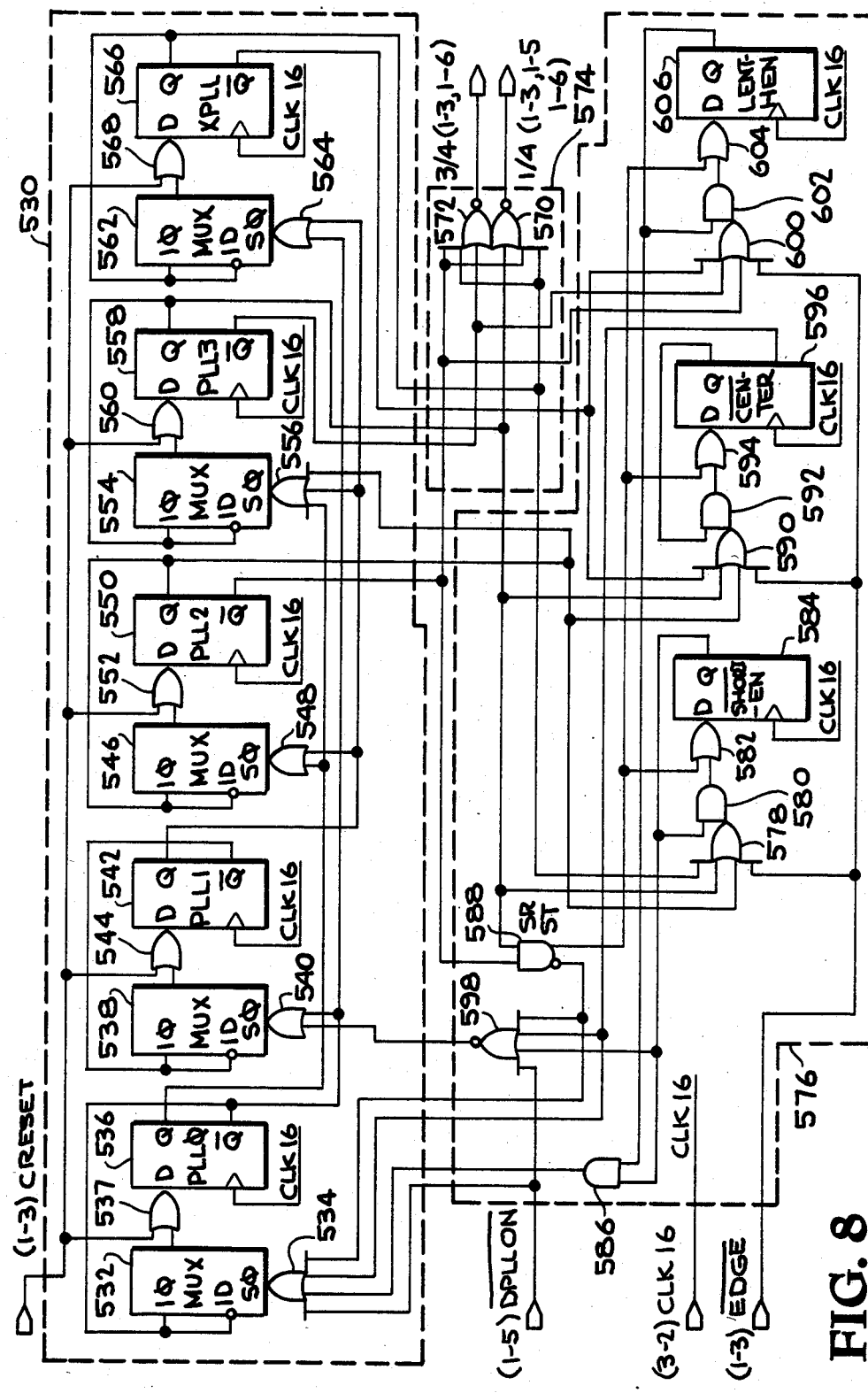
FIG. 8 is a logic diagram of the Receive Clock Recovery section of the Receiver of the present invention.

With reference to FIG. 8, the Receive Clock Recovery block 150 includes a recovered clock oscillator section 530 (152 on FIG. 2A) which receives the clock recovery preset (CRESET) signal generated by the receive supervisor section 136 and the complementary digital phase-locked loop ($\overline{DPLLON}$) signal generated by external receive clock controller section 144 and a clock signal (CLK16) from a clock internal to block 110 (not shown) with a cycle sixteen times faster than that of the clock signal recovered from the LINE DATA signals.

As shown on FIG. 8, the CRESET signal is conducted to the recovered clock oscillator section 530 which has a 5-bit counter portion which includes five D-type flip-flops and five multiplexers. A two-in, one-out multiplexer (MUX) 532 receives at a control input (S0) the signal generated at the output terminal of an OR gate 534, which signal is used by the MUX 488 to select which of the signals applied to MUX 488 at a 1Q or a complemented 1D terminal will be generated at an output of MUX 488. The OR gate 534 receives at a first input the $\overline{DPLLON}$ signal.

A PLL0 D-type flip-flop 536 receives at its data input (D) the signal generated by an OR gate 537 which, in turn, receives at a first input the CRESET signal. A second input of OR gate 537 receives the signal generated at the output terminal of MUX 532. Flip-flop 536 also receives the CLK16 signal at its clock input. The signal generated at the complemented output terminal ($\overline{Q}$) of flip-flop 536 is conducted to a true (10) and a complemented (1D) input terminal of MUX 532. A second two-in, one-out multiplexer (MUX) 538 receives at a control input (S0) the signal generated at the output terminal of an OR gate 540, receiving in turn at a first input the signal generated at the complement output terminal ($\overline{Q}$) of flip-flop 536, which signal (S0) is used by the MUX 538 to select which of the signals applied to MUX 538 at a 1Q or a complemented 1D terminal will be generated at an output of MUX 538. A second (PLL1) D-type flip-flop 542 receives at its data input (D) the signal generated by an OR gate 544 which, in turn, receives at a first input the CRESET signal. A second input of OR gate 544 receives the signal generated at the output terminal of MUX 538. Flip-flop 542 also receives the CLK16 signal at its clock input. The signal generated at the complemented output terminal ($\overline{Q}$) of flip-flop 542 is conducted to a true (1Q) and a complemented (1D) input terminal of MUX 538.

A third two-in, one-out multiplexer (MUX) 546 receives at a control input (S0) the signal generated by an OR gate 548 which, in turn, receives at a first input the signal generated at the output terminal (Q) of flip-flop 536, which signal is also conducted to true (1Q) and complemented (1D) inputs of MUX 532. A second input of OR gate 548 receives the signal generated at the true output terminal (Q) of flip-flop 542. The control signal is used by the MUX 546 to select which of the signals applied to MUX 546 at a 1Q or a complemented 1D terminal will be generated at an output of MUX 546. A third (PLL2) D-type flip-flop 550 receives at its data input (D) the signal generated by an OR gate 552 which, in turn, receives at a first input the CRESET signal. A second input of OR gate 552 receives the signal generated at the output terminal of MUX 546. Flip-flop 550 also receives the CLK16 signal at its clock input. The signal generated at the true output terminal (Q) of flip-flop 550 is conducted to a true (10) and a complemented (1D) input terminal of MUX 546.

A fourth two-in, one-out multiplexer (MUX) 554 receives at a control input (S0) the signal generated by an OR gate 556 which, in turn, receives at a first input the signal generated at the output terminal (Q) of flip-flop 536. A second input of OR gate 504 receives the signal generated at the true output terminal (Q) of flip-flop 542. The control signal is used by the MUX 554 to select which of the signals applied to MUX 554 at a 1Q or a complemented 1D terminal will be generated at an output of MUX 502. A fourth (PLL3) D-type flip-flop 558 receives at its data input (D) the signal generated by an OR gate 560 which, in turn, receives at a first input the CRESET signal. A second input of OR gate 560 receives the signal generated at the output terminal of MUX 554. Flip-flop 558 also receives the CLK16 signal at its clock input. The signal generated at the output terminal (Q) of flip-flop 558 is conducted to true (1Q) and complemented (1D) inputs of MUX 502.

A fifth two-in, one-out multiplexer (MUX) 562 receives at a control input (S0) the signal generated by an OR gate 564 which, in turn, receives at a first input the signal generated at the complemented output terminal ($\overline{Q}$) of flip-flop 536. A second input of OR gate 512 receives the signal generated at the output terminal (Q) of flip-flop 542. The control signal is used by the MUX 510 to select which of the signals applied to MUX 510 at a 1Q or a complemented 1D terminal will be generated at an output of MUX 510. A fifth (XPLL) D-type flip-flop 566 receives at its data input (D) the signal generated by an OR gate 568 which, in turn, receives at a first input the CRESET signal. A second input of OR gate 516 receives the signal generated at the output terminal of MUX 566. Flip-flop 566 also receives the CLK16 signal at its clock input.

The signal generated at the output terminal (Q) of flip-flop 566 (XPLL) is conducted to true (1Q) and complemented (1D) inputs of MUX 562 as well as to a first input of a NOR gate 570. NOR gate 570 receives at a second input terminal the signal generated at the true (Q) output terminal of flip-flop 558 (PLL3) and at a third input terminal the signal generated at the complemented ($\overline{Q}$) output terminal of flip-flop 550 ($\overline{PLL2}$). A $\frac{1}{4}$ signal is generated at the output terminal of NOR gate 570.

The signal generated at the output terminal (Q) of flip-flop 558 (PLL3) is conducted to true (1Q) and complemented (1D) inputs of MUX 554 as well as to a first input of a NOR gate 572. NOR gate 572 receives at a second input terminal the signal generated at the true (Q) output terminal of flip-flop 556 (XPLL) and at a third input terminal the signal generated at the complemented ($\overline{Q}$) output terminal of flip-flop 550 (PLL2). A $\frac{3}{4}$ signal is generated at the output terminal of NOR gate 570. The NOR gates 570 and 572 constitute the receive clock recovery logic section 574 (154 On FIG. 2A) of block 150.

The recovered clock to data clock phase detector section 576 (156 on FIG. 2A) of Receive Clock Recovery block 150. Section 576 generates $\overline{SHORTEN}$, CENTER, $\overline{LENGTHEN}$ signals which are applied to selected OR gates 534, 540 and 556 to cause adjustments in the frequency of the clock generated by the recovered clock oscillator 530. The EDGE signal generated by the Receive Data Interpreter and Superviser section 130 is received at a first input terminal of an OR gate 578 which receives at a second input terminal the signal generated at the true (Q) output terminal of flip-flop 558 (PLL3), at a third input terminal the signal generated at the true (Q) output terminal of flip-flop 550 (PLL2), and at a fourth terminal the signal generated at the true (Q) output terminal of flip-flop 566 (XPLL).

The output terminal of OR gate 578 is connected to a first input terminal of an AND gate 580, which in turn has its output terminal connected to a first input terminal of an OR gate 582. OR gate 582 generates at its output terminal a signal received at a data (D) input terminal of a $\overline{SHORTEN}$ D-type flip-flop 584. Flip-flop 584 receives at its clock input terminal the CLK16 signal and generates at its true (Q) output terminal a $\overline{SHORTEN}$ signal which is conducted to a second input terminal of AND gate 580 and to the first input terminal of an AND gate 586. A second input terminal of OR gate 582 receives the setreset (SRST) signal generated at a true output terminal of an AND gate 588. AND gate 588 receives at a first input terminal the $\overline{PLL3}$ signal generated by flip-flop 558 and at a second input terminal the $\overline{PLL2}$ signal generated by flip-flop 550.

The EDGE signal generated by the Receive Data Interpreter and Superviser section 130 is also received at a first input terminal of an OR gate 590 which receives at a second input terminal the signal generated at the true (Q) output terminal of flip-flop 558 (PLL3), at a third input terminal the signal generated at the true (Q) output terminal of flip-flop 550 (PLL2), and at a fourth terminal the signal generated at the complemented ($\overline{Q}$) output terminal of flip-flop 566 ($\overline{XPLL}$). The output terminal of OR gate 590 is connected to a first input terminal of an AND gate 592, which in turn has its output terminal connected to a first input terminal of an OR gate 594. OR gate 594 generates at its output terminal a signal received at a data (D) input terminal of a $\overline{\text{CENTER}}$ D-type flip-flop 596. Flip-flop 596 receives at its clock input terminal the CLK16 signal and generates at its true (Q) output terminal a $\overline{\text{CENTER}}$ signal which is conducted to a second input terminal of AND gate 592 and at its complemented ($\overline{Q}$) output terminal a complemented $\overline{\text{CENTER}}$ signal to a first input terminal of a NOR gate 598 and to a second input terminal of OR gate 534. A second input terminal of NOR gate 598 receives the complemented setreset ($\overline{\text{SRST}}$) signal generated at a complemented output terminal of the AND gate 588. NOR gate 598 receives at a third input terminal the $\overline{\text{SHORTEN}}$ signal generated by flip-flop 584 and at a fourth input terminal the $\overline{\text{DPLLON}}$ signal generated by Receive Decode Logic block 140. The signal generated at the output of NOR gate 598 is received at a second input to OR gate 540 within oscillator section 530. A second input terminal of OR gate 534 within oscillator section 534 receives the complemented setreset ($\overline{\text{SRST}}$) signal generated at the complemented output terminal of the AND gate 588. OR gate 534 receives at a third input terminal the complementary $\overline{\text{CENTER}}$ signal generated by flip-flop 596 and at a fourth input terminal the signal generated at the output terminal of AND gate 586.

The $\overline{\text{EDGE}}$ signal generated by the Receive Data Interpreter and Superviser section 130 is also received at a first input terminal of an OR gate 600 which receives at a second input terminal the signal generated at the complemented ($\overline{Q}$) output terminal of flip-flop 558 ($\overline{\text{PPL3}}$), at a third input terminal the signal generated at the complementary ($\overline{Q}$) output terminal of flip-flop 550 ($\overline{\text{PPL2}}$), and at a fourth terminal the signal generated at the complementary ($\overline{Q}$) output terminal of flip-flop 566 ($\overline{\text{XPLL}}$).

The output terminal of OR gate 600 is connected to a first input terminal of an AND gate 602, which in turn has its output terminal connected to a first input terminal of an OR gate 604. OR gate 604 generates at its output terminal a signal received at a data (D) input terminal of a $\overline{\text{LENGTHEN}}$ D-type flip-flop 606. Flip-flop 606 receives at its clock input terminal the CLK16 signal and generates at its true (Q) output terminal a $\overline{\text{LENGTHEN}}$ signal which is conducted to a second input terminal of AND gate 602 and to a second input terminal of an AND gate 586. A second input terminal of OR gate 604 receives the setreset (SRST) signal generated at the true output terminal of AND gate 588.

Figure 9:
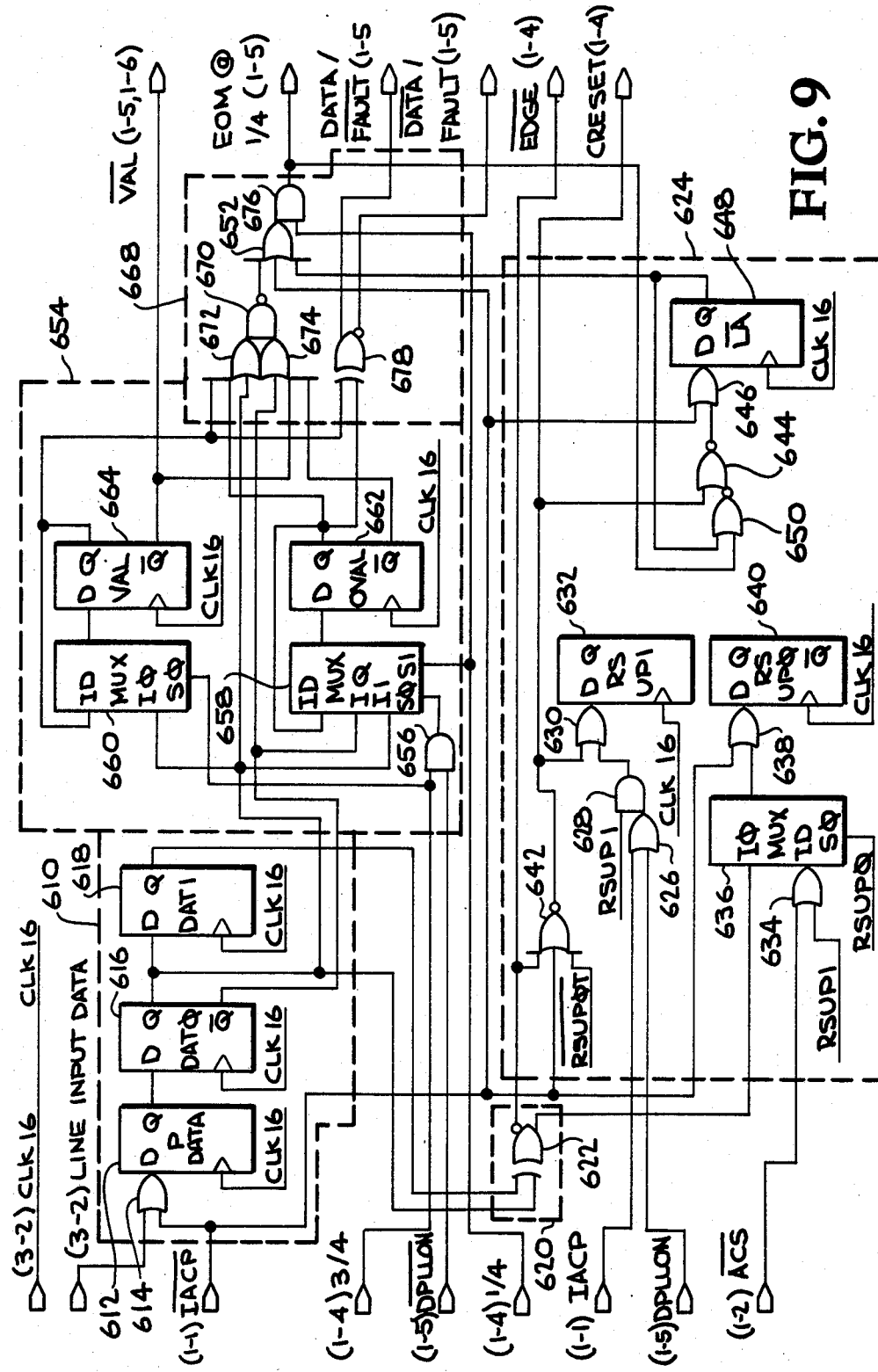
FIG. 9 is a logic diagram of the Receive Data Interpreter and Supervisor section of the Receiver of the present invention.

With reference to FIG. 9, the Receive Data Interpreter and Supervisor block 130 includes an input data synchronizer 610 (132 on FIG. 2B) which receives the LINE INPUT DATA signals and the $\overline{\text{IACP}}$ signal generated by flip-flop 440 (FIG. 6), and the CLK16 signal. A first buffering D-type flip-flop 612 receives at its data input (D) the output signal generated by an OR gate 614 which receives the LINE INPUT DATA and $\overline{\text{IACP}}$ signals. Flip-flop 612 also receives the CLK 16 signal at its clock input. A second buffering D-type flip-flop 616 receives at its data input (D) the signal generated at the true (Q) output terminal of flip-flop 612. Flip-flop 616 receives the CLK16 signal at its clock input terminal. A third buffering D-type flip-flop 618 receives at its data input (D) and DAT0 signal generated at the true (Q) output terminal of flip-flop 616, as well as the CLK16 signal at its clock input terminal.

Block 130 also include a data zero-crossing detector 620 (134 on FIG. 2B) which comprises an exculsive-OR (XOR) gate 622 which receives the DAT0 and DAT1 signals generated at the true (Q) output terminals of flip-flops 616 and 618, respectively. Gate 622 generates therefrom, at a complemented output, the $\overline{\text{EDGE}}$ signal.

Block 130 also includes the Receive Supervisor portion 624 (136 on FIG. 2B) which receives the true and complemented signals generated at the output terminals of XOR gate 622 as well as the DPLLON, $\overline{\text{ACS}}$, IACP, $\overline{\text{IACP}}$, ¼ signals described earlier in connection with blocks 110, 120 and 150 of receiver 100. An OR gate 626 receives the IACP and DPLLON signals and generates therefrom a signal received at a first input of an AND gate 628 which, in turn, generates a signal received at a first input of an OR gate 630. The output terminal of OR gate 630 is connected to the data input (D) terminal of a D-type flip-flop 632 which generates at its true (Q) output terminal an RSUP1 signal. Flip-flop 632 also receives the CLK16 signal at its clock input terminal. The RSUP1 signal is received at a second input terminal of AND gate 628, as well as a first input terminal of an OR gate 634. OR gate 634 receives at a second input the $\overline{\text{ACS}}$ signal generated by AND gate 522 (FIG. 7). The output terminal of OR gate 634 is connected to a first (1D) input terminal of a two-in, one-out multiplexer (MUX) 636 which receives at a second (1Q) input terminal the signal generated at the true output terminal of XOR gate 622. MUX 636 generates at its output terminal a signal conducted to a first input of an OR gate 638 which also receives at a second input the $\overline{\text{IACP}}$ signal.

The output terminal of OR gate 638 is connected to the data (D) input terminal of a D-type flip-flop 640 which generates at its true (Q) and complemented output terminals an RSUP0, and $\overline{\text{RSUP0}}$ signals, respectively. Flip-flop 640 also receives the CLK 16 signal at its clock input terminal. MUX 636 receives at a control (S0) the RSUP0 signal, which signal is used by the MUX 636 to select which of the signals applied to MUX 636 at its 1Q or 1D terminals will be generated at its output terminal.

The Receive Supervisor portion 624 of block 130 also includes a NOR gate 642 which receives the $\overline{\text{RSUP0}}$, IACP and $\overline{\text{EDGE}}$ signals and generates therefrom a CRESET signal conducted to a second input terminal of OR gate 630, to Receive Clock Recovery block 150, described above, and to a first input terminal of a NOR gate 644. An OR gate 646 receives the $\overline{\text{IACP}}$ signal and the signal generated by NOR gate 644 and generates therefrom a signal conducted to the data input (D) of a D-type flip-flop 648. Flip-flop 648 also receives the CLK16 signal at its clock input and generates at its true (Q) output terminal an $\overline{\text{LA}}$ signal which is received at a first input terminal of a NOR gate 650 as well as a first input terminal of an OR gate 652, which will be described below in connection with portion 668 of block 130.

As shown on FIG. 9, Receive Data interpreter and supervisor block 130 also includes a data ¼, ¾ cell sampler portion 654 (138 on FIG. 2B) which receives the DAT0 and $\overline{\text{DAT0}}$ signals generated by flip-flop 626 as well as the ¼, ¾ and $\overline{\text{DPLLON}}$ signals. The latter two signals are received at an AND gate 656. A three-in, one-out multiplexer (MUX) 658 receives at a first control input (S0) the signal generated at the output of AND gate 656 and at a second control input (S1) and ¼ signal, and selects thereby which of the signals applied to MUX 658 at a IQ, ID of I1 terminal will be generated at an output of MUX 658.

A two-in, one-out multiplexer (MUX) 660 receives the DPLLON signal at its control input (S0), which is used to select which of the signals applied to MUX 660 at a 1D or 10 terminal will be generated at an output of MUX 660. The DAT0 signal is applied to the I1 and I1 input terminals of MUX 658 and MUX 660, respectively. The $\overline{\text{DAT0}}$ signal is applied to the IQ input terminal of MUX 658. A D-type flip-flop 662 receives at its data input (D) the signal generated at the output terminal of MUX 658 and the CLK 16 signal at its clock input. Flip-flop 662 generates at its true (Q) and complemented ($\overline{Q}$) output terminals OVAL and $\overline{\text{OVAL}}$, respectively, signals. The OVAL signal is received at the ID input terminal of MUX 658. A D-type flip-flop 664 receives at its data input (D) the signal generated at the output terminal of MUX 660 and the CLK16 signal at its clock input. Flip-flop 664 generates at its true (Q) and complemented ($\overline{Q}$) output terminals VAL and $\overline{\text{VAL}}$ signals, respectively. The $\overline{\text{VAL}}$ signal is received at the ID input terminal of MUX 660.

Finally, block 130 of receiver 100 includes a data cell status decoder portion 668 (139 on FIG. 2B) which includes the aforementioned OR gate 652. Gate 652 receives at a second input terminal the IACP signal and at a third input terminal the signal generates at the output terminal of a NAND gate 670 which, in turn, receive the signal generated at the output of OR gates 672 and 674. OR gate 672 receives the VAL, OVAL and DAT0 signals; OR gate 674 receives the $\overline{\text{DAT0}}$, $\overline{\text{VAL}}$ and $\overline{\text{OVAL}}$ signals. An AND gate 676 receives the signal generated by OR gate 652 and the ¼ signal, and generates therefrom the EOM@¼ signal, which is conducted to a second input terminal of OR gate 650 as well as to the Receive Decode Logic block 140.

Portion 668 also includes an XOR gate 678 which receives the VAL and OVAL signals and generates therefrom a DATA/FAULT and a $\overline{\text{DATA/FAULT}}$ signal at its true and complemented output terminal, respectively.

Figure 10A:
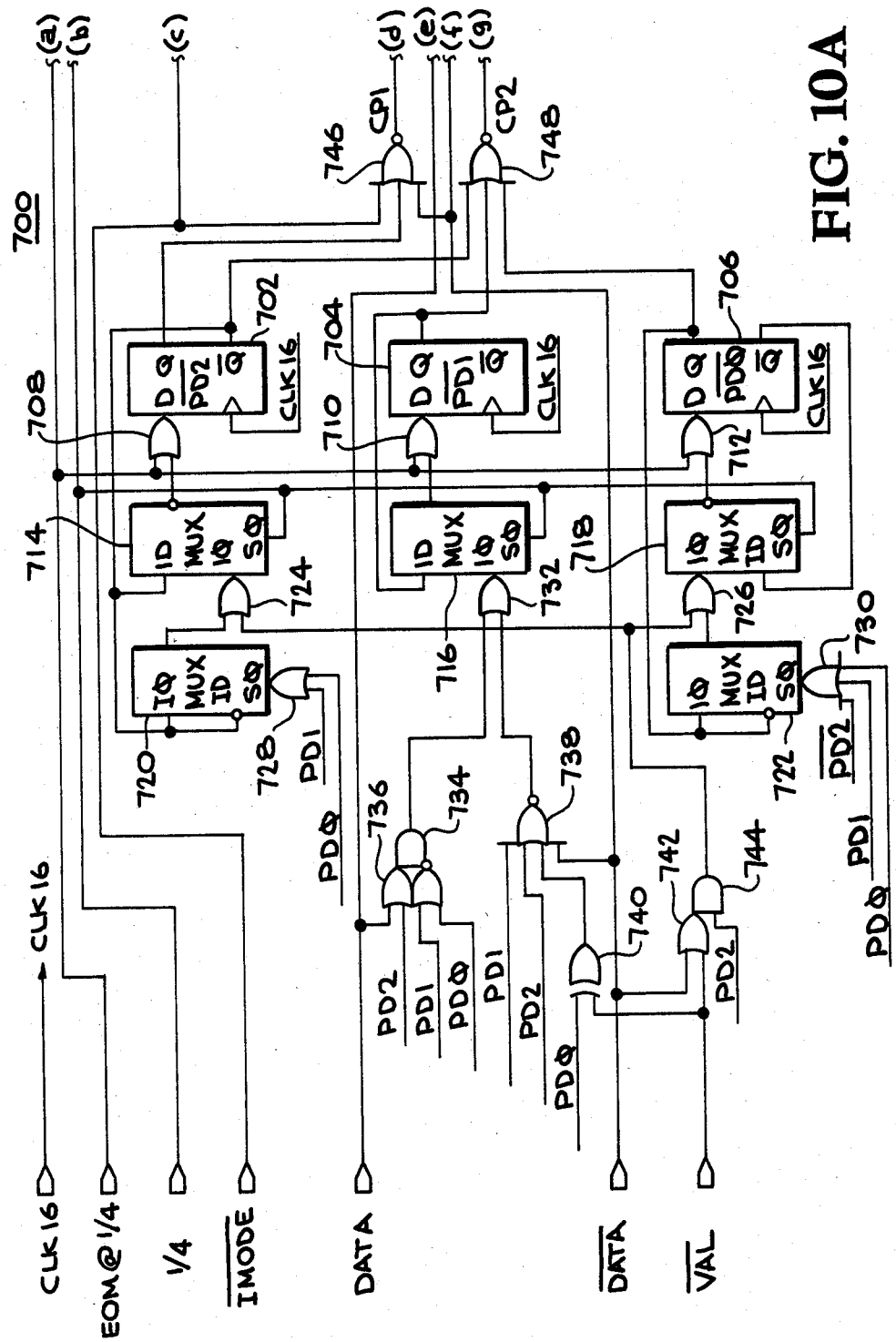
FIGS. 10A and 10B are logic diagrams of the Receive Decode Logic section of the Receiver of the present invention.
Figure 10B:
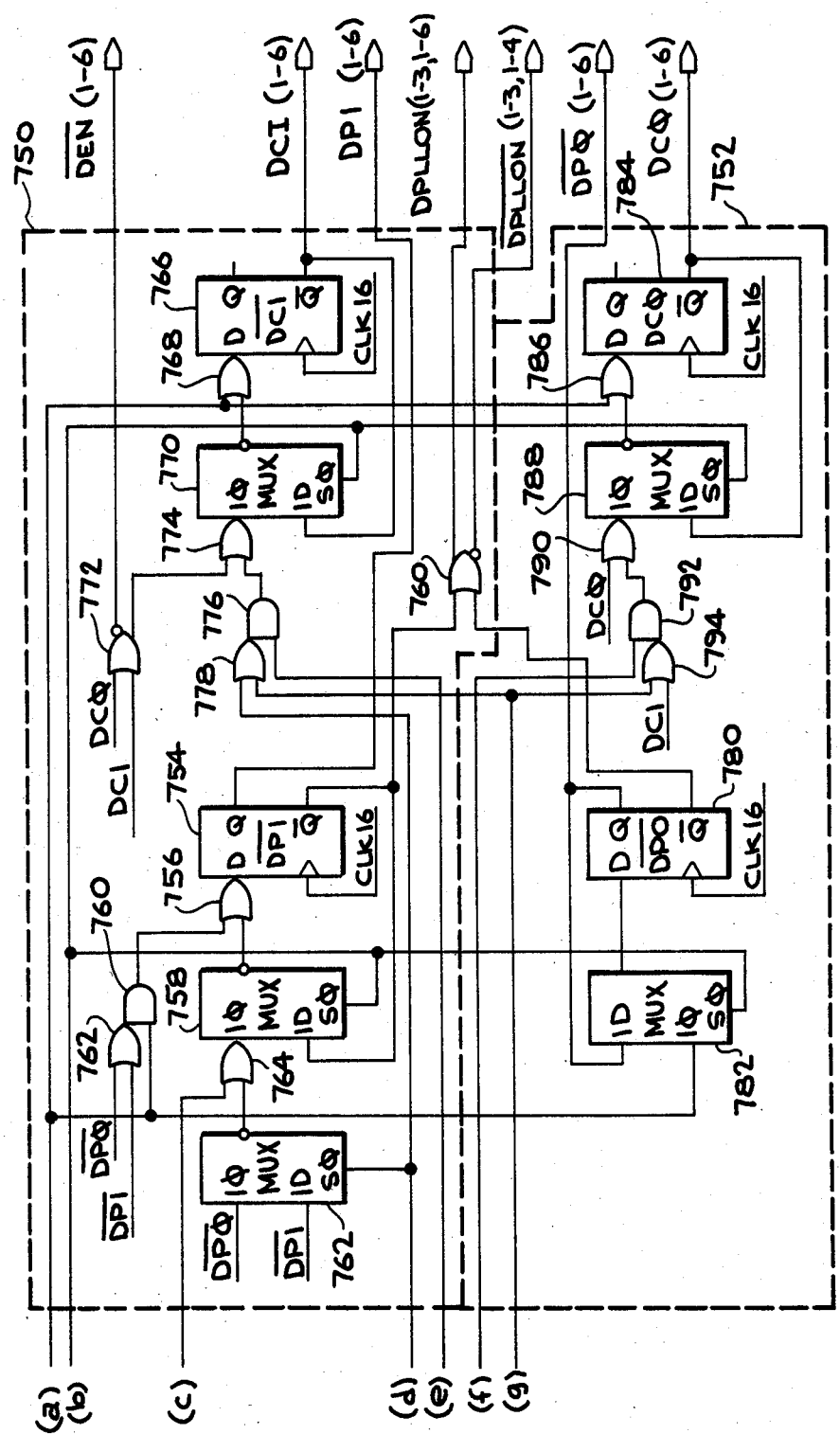

The logic diagram of Receive Decode Logic block 140 of Receiver 100 is shown in FIGS. 10A and 10B. A preamble detector portion 700 (142 on FIG. 2B) is shown in FIG. 10A, which receives the CLK16, EOM@¼, ¼, DATA, $\overline{\text{DATA}}$, and $\overline{\text{VAL}}$ signals described earlier in connection with blocks 110, 120, 130 and 150 of Receiver 100, and the $\overline{\text{IMODE}}$ signal to be described hereinafter. A set of three flip-flops 702, 704, and 706 provide a three inter-bit delay by generating at their true (Q), and complement ($\overline{Q}$), outputs preamble detector timing signals PD2 and $\overline{\text{PD2}}$, PD1 and $\overline{\text{PD1}}$, PD0 and $\overline{\text{PD0}}$, respectively. As shown in FIG. 10A, flip-flops 702, 704 and 706 receive at their data (D) input terminals the signals generated an OR gate 708, 710, 712, respectively, which, in turn, receive at a first input the EOM@¼ signal and at a second input the signal generated at an output of a two-in, one-out multiplexer (MUX) 714, 716, 718, respectively. Flip-flops 702, 704, and 706 receive the CLK16 signal at their clock inputs. MUX 714, 716 and 718 each receive at a control input (S0) the $\overline{\text{IMODE}}$ signal, which signal is used by the MUX to which of the signals applied at their 1Q or 1D terminals will be generated at their respective output terminals.

MUX 714 and 716 receive at their 1D input terminals the output generated at the $\overline{Q}$, respectively, Q, output terminal of flip-flop 702, 706, respectively. A two-in, one output MUX 720, 722, respectively, generate at their output terminals a signal received at a first input terminal of an OR gate 724, 726, respectively, which in turn, generates a signal received at the 1D, 10, respectively, input terminal of MUX 714, 718, respectively. The signal generated at the Q output terminal of flip-flop 706 is received at the true (10) and complemented (1D) input terminals of MUX 722, and the signal generated at the $\overline{Q}$ output terminal of flip-flop 706 is received at the 1D input terminal of MUX 718.

MUX 720, 722, respectively, receives at its control input (S0) the output signal generated by an OR gate 728, 730, respectively, receiving, in turn the PD1 and PD0 signals, the PD0, P1 and $\overline{\text{PD2}}$ signals, respectively. The MUX 716 receives at its 10 input terminal the signal generated by an OR gate 732. OR gate 732 receives at a first input terminal the signal generated by an AND gate 734 which, in turn, receives at a first input terminal the signal generated by an OR gate 736 which receives the DATA and PD2 signals and at second complemented input terminal the signal generated by an OR gate 738 which receives the PD1, PD2, DATA signals and the signal generated by an XOR gate 740. XOR gate, turn, receives the PD0 and $\overline{\text{VAL}}$ signals.

The $\overline{\text{DATA}}$ and $\overline{\text{VAL}}$ signals are received by an OR gate 742 which generates therefrom a signal conducted to a first input terminal of an AND gate which receives the PD2 signal at a second input terminal. The signal generated by AND gate 744 is conducted to a second input terminal of OR gates 724 and 726.

Preamble Detector 700 generates at NOR gates 746 and 748, CP1 and CP2 signals, respectively, each receiving the IMODE, PD2 and $\overline{\text{DATA}}$ signals, and the PD2, PD1 and $\overline{\text{PD0}}$ signals, respectively. The CP1 and CP2 signals are conducted to the External Receive Clock Controller 750 (144 on FIG. 2B) and the CP2 signal to the Receiver Data Controller 752 (146 on FIG. 2B), as shown on FIG. 10B.

Section 750 includes a flip-flop 754 receives at its data (D) input the signal generated by an OR gate 756 which, in turn, receives at a first input terminal the signal generated by a two-input, one-output MUX 758. MUX 758 receives at its control input (S0) the ¼ signal, which signal is used to select which of the signals applied to MUX 758 at its 1Q or 1D terminal will be generated at its output terminal. A second input terminal of OR gate 756 receives the signal generated at the output of a AND gate receiving, in turn, the EOM@¼ signal and the signal generated at the output of an OR gate 762 receiving at a first input the DP1 signal generated at the (Q) output of flip-flop 754. Flip-flop 754 also receives the CLK16 signal at its clock input. The DP1 signal generated at the $\overline{Q}$ output terminal of flip-flop 754 is conducted to the 1D input terminal of MUX 758 and to a first input of an OR gate 760. OR gate 760 generates at a true output terminal the DPLLON signal and at complemented output terminal the $\overline{\text{DPLLON}}$ signals. A two-input, one-output MUX 762 receives at its control input terminal (S0) the CP1 signal, which signal is used to select which of the signals applied to its 1Q or 1D output terminal will be generated at its output, which is conducted to a first input of an OR gate 764. Gate 764 receives the $\overline{\text{IMODE}}$ signal at a second input and generates therefrom a signal conducted to the 10 input terminal of MUX 758. MUX 762 receives at its 10 input the DP0 signal.

Section 750 also includes a flip-flop 766 receiving at its data (D) input terminal the signal generated by an OR gate 768, which, in turn, receives the EOM@¼ signal and the signal generated at the complemented output of a two-input, one-output MUX 770. Flip-flop 766 generates at its complemented ($\overline{Q}$) output terminal a DCI signal which is received at the 1D iput terminal of MUX 770. Flip-flop 766 also receives the CLK16 signal at its clock input. MUX 770 receives at its control input (S0) the $\overline{\text{IMODE}}$ signal, which signal is used to select which of the signals applied to MUX 770 at its 1Q or 1D terminal will be generated at a (complemented) output of MUX 770. Section 750 also includes an OR gate 772 which receives at a first input terminal the DC1 signal generated by flip-flop 770 and generates at a true output terminal a signal received at a first input terminal of an OR gate 774 which, in turn, generates a signal received by the 10 input of MUX 770. OR gate 774 receives at a second input terminal the signal generated by an AND gate 776 which receives at a first input the DATA signal and at a second input the signal generated by an OR gate 778 which, in turn, receives the CP1 and CP2 signals. OR gate 772 generated at a complemented output terminal the $\overline{\text{DEN}}$ signal.

As shown on FIG. 10B, section 752 includes a flip-flop 780 received at its data (D) input the signal generated by a two-input, one-output MUX 782. MUX 782 receives at its control input (S0) the ¼ signal, which signal is used to select which of the signals applied to MUX 758 at its 1Q or 1D terminal will be generated at its output terminal. The DP0 signal generated at the Q output terminal of flip-flop 780 is conducted to the 1D input terminal of MUX 782. The signal generated at the complemented ($\overline{Q}$) terminal of flip-flop 780 is conducted to a second input of an OR gate 760.

Section 572 also includes a flip-flop 784 receiving at its data (D) input terminal the signal generated by an OR gate 786, which, in turn, receives the EOM@¼ signal and the signal generated at the complemented output of a two-input, one-output MUX 788. Flip-flop 784 generates at its complemented ($\overline{Q}$) output terminal a DC0 signal which is received at the 1D input terminal of MUX 788. Flip-flop 784 also receives the CLK16 signal at its clock input. MUX 788 receives at its control nput (S0) the $\overline{\text{IMODE}}$ signal, which signal is used to select which of the signals applied to MUX 788 at its 1Q or 1D terminal will be generated at a (complemented) output of MUX 788. Section 750 also includes an OR gate 790 which receives at a first input terminal the DC1 signal generated by flip-flop 772 and generates at an output terminal a signal received by the 10 input of MUX 788. OR gate 790 receives at a second input terminal the signal generated by an AND gate 792 which receives at a first input the $\overline{\text{DATA}}$ signal and at a second input the signal generated by an OR gate 794 which, in turn, receives the DC1 and CP2 signals. The signal generated at the $\overline{Q}$ terminal of flip-flop 780 is conducted to a second input terminal of OR gate 760 and the $\overline{\text{DP0}}$ signal generated at the Q terminal of flip-flop 780 is conducted to the I0 input terminal of MUX 762 and a second input of OR gate 762 and the signal generated at the true (Q) output terminal of flip-flop 784 is conducted to a second input terminal of OR gate 772.

Figure 2B:
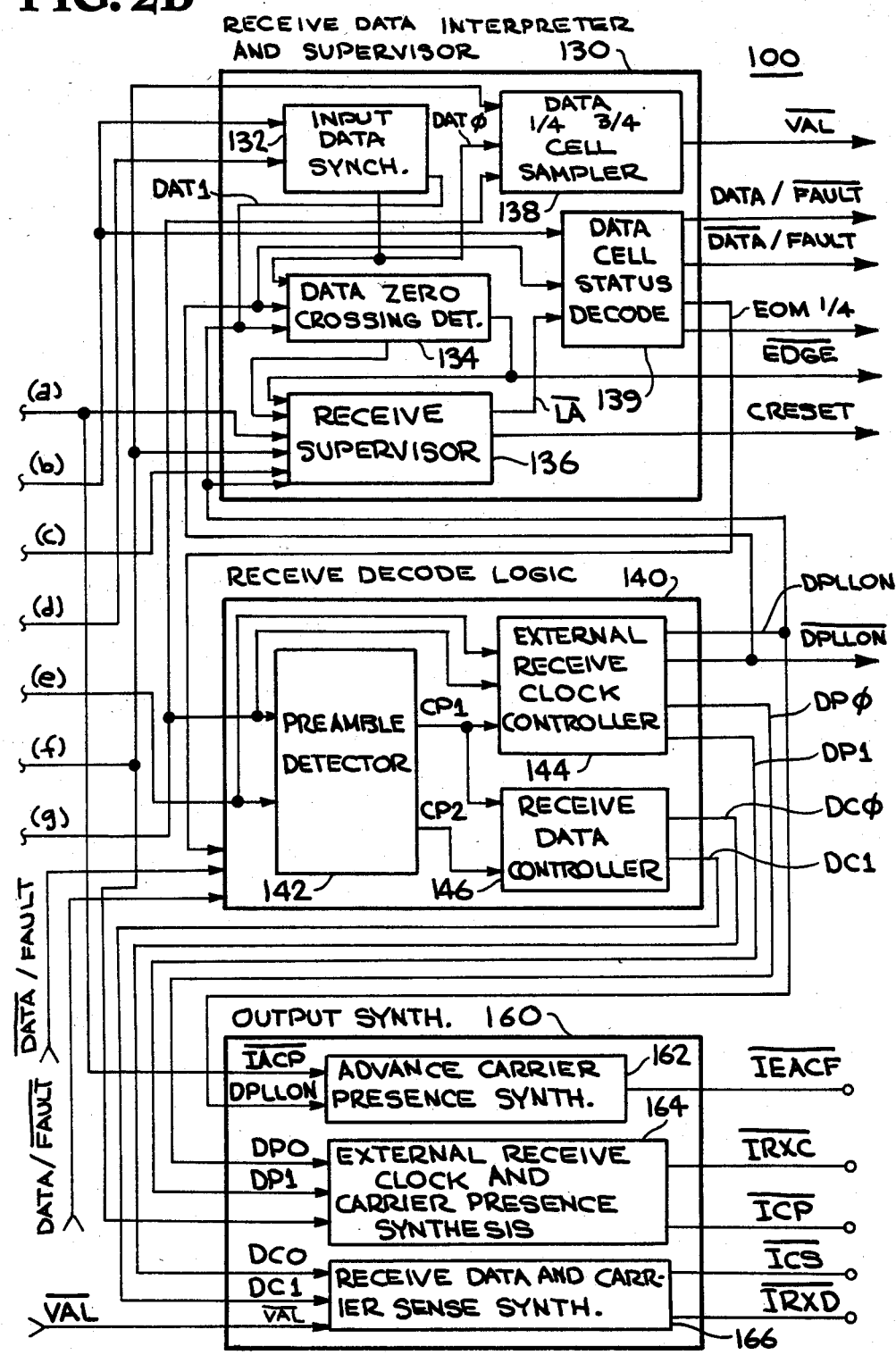
Figure 11:
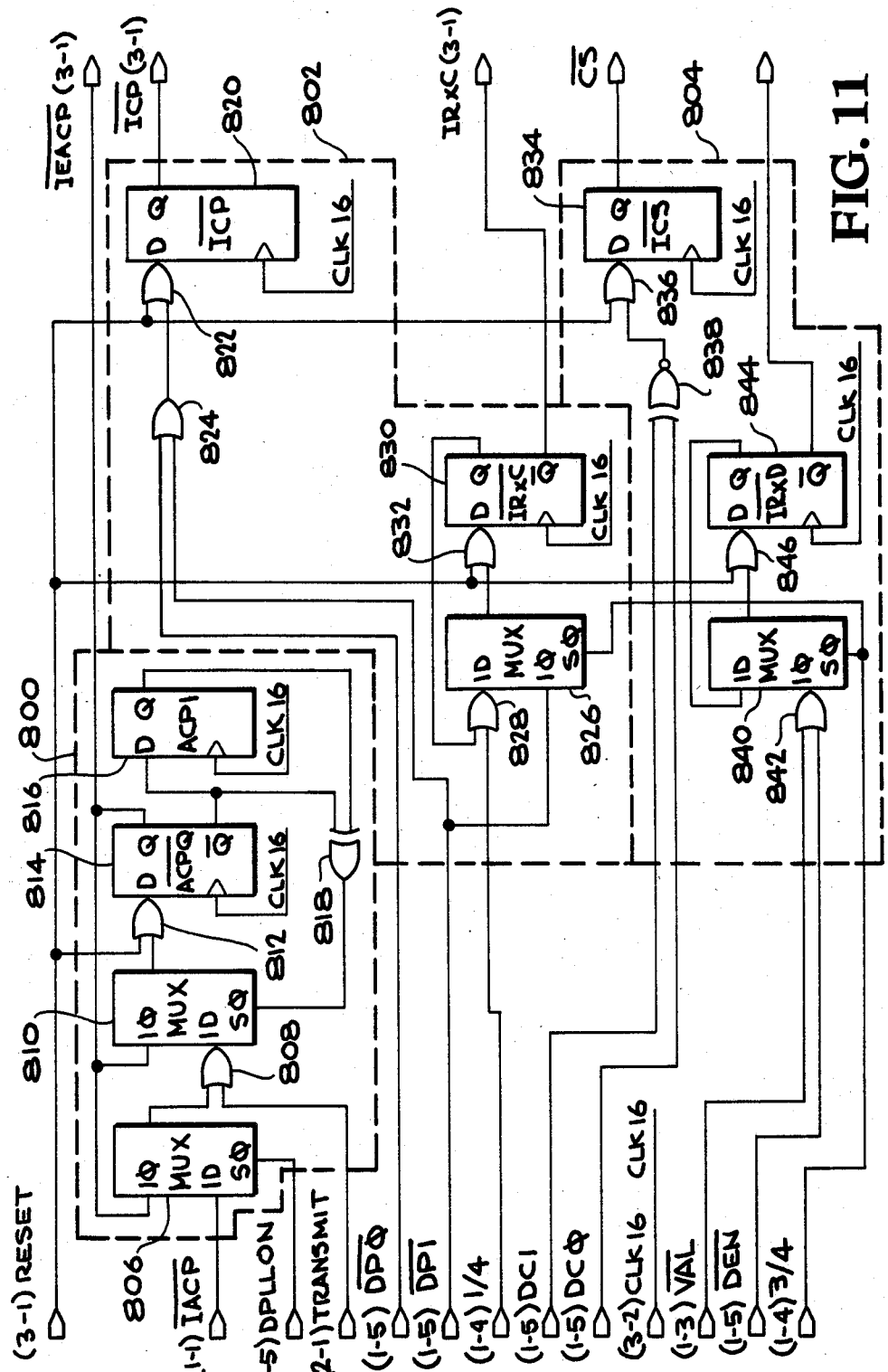
FIG. 11 is a logic diagram of the Receive Output Synthesizers section of the Receiver of the present invention.

Finally, the logic diagram of Output Synthesizer block 160 of Receiver 160 is shown on FIG. 11; consisting of an Advanced Carrier Presence Synthesizer portion 800 (162 on FIG. 2B), an External Receiver clock and Carrier presence synthesis portion 802 (164 on FIG. 2B) and a Receive Data and Carrier Sense Synthesizer portion 804 (166 on FIG. 2B).

As shown on FIG. 11, portion 800 includes a two-input, one-output MUX 806 which receives the DPLLON signal at a control input (S0) which signal is used by MUX 806 to select which of the signals applied to MUX 806 at a 1Q or a 1D terminal will be generated at an output of MUX 806. The $\overline{\text{IACP}}$ signal is applied to the 1D terminal of MUX 806. An OR gate 808 receives the output signal generated by MUX 806 and the TRANSMIT signal and generates therefrom a signal received at a 1D input of a two-input, one-output MUX 810. An OR gate 812 receives the signal generated at the output terminal of MUX 810 and the RESET signal and generates therefrom a signal received at a data (D) input of a D-type flip-flop 814 which generates a complemented advanced carrier presence ($\overline{\text{ACP}}$) signal at its (Q) output terminal which signal is conducted to the 10 input terminals of MUX 806 and 810. Flip-flop 814 generates at its $\overline{Q}$ output terminal a signal received at a data (D) input of a D-type flip-flop 816 as well as at a first input of an XOR gate 818. Flip-flop 816 generates at its (Q) output terminal a signal conducted to a second input of XOR gate 818, which generates therefrom a signal conducted to the S0 control input of MUX 810. The flip-flop's 814 and 816 each receive the CLK16 signal at their clock input terminals.

Portion 802 includes a D-type flip-flop 820 which receives at its data (D) input the signal generated by an OR gate 822 which, in turn, receives the RESET signal and the signal generated by an OR gate 824 receiving the $\overline{\text{DP0}}$ and $\overline{\text{DP1}}$ signals. Flip-flop 820 receives the CLK16 signal at its clock input terminal. Flip-flop 820 generates at its Q output terminal the complemented carrier presence ($\overline{\text{CP}}$) signal. Portion 802 also includes a two-input, one-output MUX 826 which receives at its control input (S0) the ¾ signal; which signal is used by the MUX 826 to select which of the signals applied at a 1Q or a 1D terminal will be generated at an output of MUX 826. The 10 terminal of MUX 826 receives the $\overline{\text{DP1}}$ signal and the 1D terminal receives the signal generated by an OR gate 828 which, in turn, receives at a first input terminal the ¼ signal and at a second input terminal the signal generated by a D-type flip-flop 830 at its Q output terminal. Flip-flop 830 receives at its data (D) input the signal generated by an OR gate 832 which receives, in turn, the RESET signal and the signal generated at the output terminal of MUX 826. Flip-flop 830 also receives the CLK 16 signal at its clock input and generates at its $\overline{Q}$ output the RXC signal.

Portion 804 includes a D-type flip-flop 834 which receives at its data (D) input the signal generated by an OR gate 836 which, in turn, receives the RESET signal and the signal generated at the complemented output terminal of an XOR gate 838 receiving the $\overline{\text{DC0}}$ and $\overline{\text{DC1}}$ signals. Flip-flop 834 receives the CLK16 signal at its clock input terminal. Flip-flop 834 generates at its Q output terminal the complemented carrier sense ($\overline{\text{CS}}$) signal. Portion 804 also includes a two-input, one-output MUX 840 which receives at its control input (S0) the ¾ signal; which signal is used by the MUX 840 to select which of the signals applied at a 1Q or a 1D terminal will be generated at an output of MUX 840. The 10 terminal of MUX 840 receives the signal generated by an OR gate 842 which, in turn, receives the $\overline{\text{VAL}}$ and $\overline{\text{DEN}}$ signals and a 10 terminal receives the signal generated by a D-type flip-flop 844 at its Q output terminal. Flip-flop 844 receives at its data (D) input the signal generated by an OR gate 846 which receives, in turn, the RESET signal and the signal generated at the output terminal of MUX 840. Flip-flop 844 also receives the CLK16 signal at its click input and generates at its $\overline{Q}$ output the RXD signal.

D. Internal Signal Characteristics of the Manchester-encoded Receiver

The Manchester-encoded Receiver 100 of the instant invention generates several key internal interface signals. Related to the detection of line activity function of the Receiver 100 are the following internal signals: Internal advance carrier presence (IACP) which indicates if there is line activity. A line signal having a differential voltage greater than the positive carrier presence level or less than the negative carrier presence level will cause Receiver 100 to set IACP HIGH and to retain this value until there is no line signal having such a differential voltage for two consecutive bit times.

A second internal signal is advanced carrier sense (ACS) which indicates if the line activity which caused the Receiver 100 to set IACP HIGH is valid Manchester-encoded data. The Receiver 100 sets $\overline{ACS}$ HIGH if the detected line signal has a differential voltage greater than the positive carrier presence level followed within a window of $\frac{3}{4}$ to $1\frac{1}{4}$ bit times by a voltage less than the negative carrier presence level, or if the line signal has a differential voltage less than the negative carrier presence level followed within the window by a voltage greater than the positive carrier presence level. The ACS signal is set HIGH only when IACP is HIGH or during the first clock interval after IACP has been set low.

An edge (EDGE) internal signal is set HIGH whenever the Receiver 100 detects a zero-crossing by the input line data. A clock recovery preset (CRESET) signal is set HIGH for one clock cycle following the next line data edge (EDGE HIGH) after the line activity is detected, (IACP HIGH), and the data qualification is complete (ACS HIGH). CRESET is set HIGH once during reception of input line data by Receiver 100. A line acquisition (LA) signal is set HIGH following CRESET set HIGH until a physical (line quiet) or logical (decoded) end-of-message.

The data-sampling signals $\frac{1}{4}$ and $\frac{3}{4}$ are used to determine whether the line input data is valid Manchester-encoded. The line data is sampled at a $\frac{1}{4}$ and a $\frac{3}{4}$ interval from the start of an inter-bit time interval. A DATA signal is set HIGH if the decoded line data is valid Manchester-encoded based on the opposite logical polarity at the $\frac{1}{4}$ and $\frac{3}{4}$ sample-times. A logical end-of-message (EOM $\frac{1}{4}$) is set HIGH whenever no line activity is detected and will be reset low when CRESET is set HIGH and will remain low until the logical end of message or LA is set low.

A digital phase-locked loop on (DPLLON) signal is set HIGH on the $\frac{1}{4}$ sample interval after the CRESET and LA signals have been set HIGH. The HIGH DPLLON signal indicator that the line activity detection function of the Receiver 100 has been accomplished and that the Receive Supervisor can start to generate the external receive output signals RxC and RxD. Accordingly, A HIGH DPLLON signal must be followed by a resetting of DPLLON to LOW before the Receiver 100 can begin line activity detection again.

E. Method for Detection of Line Activity

Figure 5:
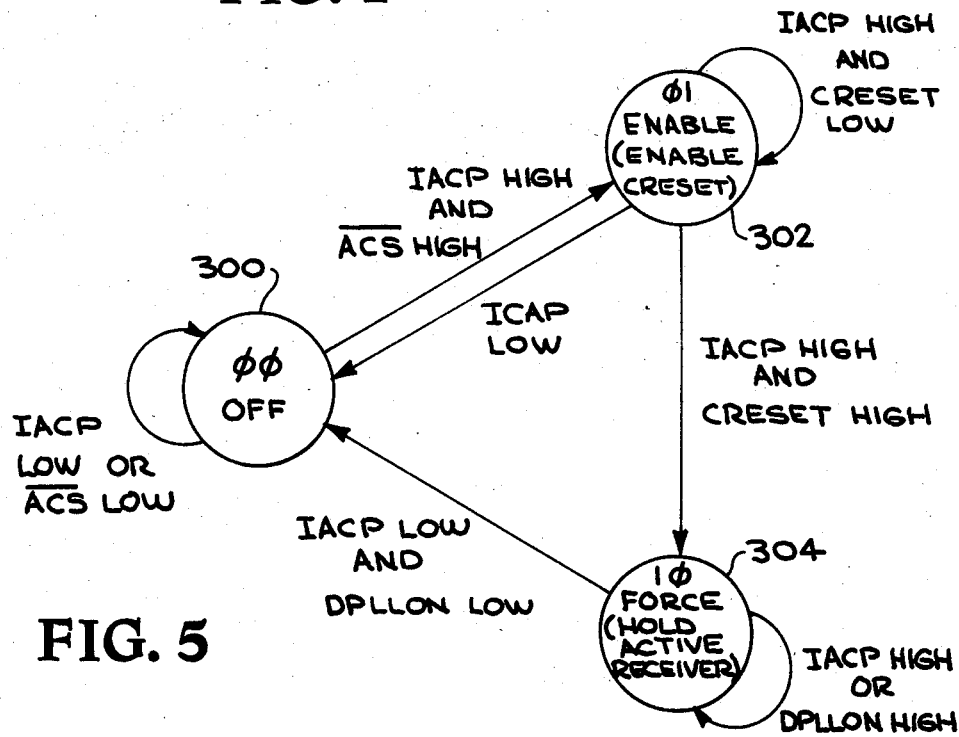
FIG. 5 is a state diagram of the Supervisor section of the Receiver of the present invention.

The Receiver 100 according to the present invention detects the presence of valid Manchester-encoded data applied to the RxL0, RxL1 terminals by a method best understood by reference to the receiver supervisor state machine illustrated in FIG. 5.

Initially, the Receiver 100 is in an OFF state, 300. The Receiver channel interface 10 has not generated ST+ or ST− signals which satisfy the conditions described above calling for generation of the HIGH IACP signal. In this state, no output signals are generated at the Receiver 100 output terminals RxC or RxD, and the recovered clock oscillator portion of block 150 is asynchronous. The detection at the channel interface 10 of line activity will cause Receiver 100 to generate a HIGH IACP signal and upon detection of valid Manchester-encoded input data, the $\overline{ACS}$ signal is set HIGH and the Supervisor changes to ENABLE state, 302. If line activity is detected but Manchester-encoded input data is not detected, $\overline{ACS}$ will remain inactivated LOW and the Receiver 100 will remain in the OFF state, 300.

Receiver 100 will remain in the ENABLE state, 302, awaiting generation of a first HIGH EDGE signal indicating detection of a zero-crossing by the input line data. Alternatively, the line may become inactive and IACP will be reset LOW and, as illustrated in FIG. 5, receiver 100 will return to the OFF state, 300. When EDGE is set HIGH, the CRESET signal is changed from LOW to HIGH and Receiver 100 will enter a hold active (FORCE) state 304 resetting to OFF state 300 only when the input line activity ends (IACP LOW) and receive output signals cease to be generated (DPLLON LOW), as shown in FIG. 5.

In the transition from ENABLE state 302 to the FORCE state 304, as CRESET is set to HIGH, the LA signal is set HIGH. Following LA being set to HIGH, the data decoder section within block 140 will reflect line input data until the line becomes inactive or an end-of-message is received. Finally, in the FORCE state 304, the data decoder uses the previous $\frac{1}{4}$ and $\frac{3}{4}$ samples and the current $\frac{1}{4}$ sample to determine valid Manchester-encoded data. If the previous samples are opposite binary polarity, the previous cell is a valid Manchester cell (DATA HIGH); if the previous samples are of the same polarity and equal to the current $\frac{1}{4}$ sample, a logical end-of-message (EOM $\frac{1}{4}$) HIGH Is generated. Otherwise an invalid Manchester cell is detected (DATA LOW). Since there is no previous $\frac{1}{4}$ sample following the first Manchester cell after CRESET is set HIGH, a valid previous $\frac{1}{4}$ sample must be forced in this case.

E. Device for Detection of Line Activity

The Receiver 100 according to the present invention detects valid Manchester-encoded data applied to the RxL0, RxL1 terminals by first generating at the Receiver channel interface 10 the ST+, ST− and INPUT DATA signals described above in connection with FIGS. 1 and 3. Receiver 100 contains an internal clock (not shown in FIG. 2) having a frequency sixteen times the inter-bit frequency of the bit stream (16x clock) applied to the RxL0, RxL1 terminals.

For a detailed description of the voltage-controlled oscillator (VCO) providing the 16x internal clock, reference should be had to copending application Ser. No. 520,876, filed Aug. 5, 1983, now U.S. Pat. No. 4,565,976, on behalf of David Campbell entitled "An Interruptible Voltage-Controlled Oscillator", assigned to the assignee of the instant application, which is hereby incorporated by reference.

The ST+ and ST− signals are applied to a positive pulse catcher 112 (400 on FIG. 6) portion of Receive Line Activity Counter block 110 via signal lines 102 and 104, respectively, (FIG. 2). An advanced line signal (ALS) is generated by pulse catcher 112 when either ST+ or St− signal has been conducted to the pulse catcher and on the rising edge of the 16x clock internal to the block 110, the ALS signal is stored in a flip-flop 114 (404 on FIG. 6) internal to block 110 and pulse catcher 112 is reset to await another application of either the ST+ or ST− signals.

At the next internal clock cycle of block 110, the flip-flop 114 storing the ALS signal is clocked and a HIGH complement signal IARST is generated therefrom and applied to reset a 2-bit line active time-out counter 116 internal to block 110 and to set a flip-flop 118 (440 on FIG. 6) connected to the counter 116 which generates a HIGH internal ACP (IACP) signal. When the counter 116 overflows, indicating no line activity for 2 bit lines, the reset input of flip-flop 118 receives the signal generated by the counter overflow and the IACP signal is reset LOW.

Referring again to FIG. 2, the $\overline{\text{IACP}}$ signal generated by flip-flop 118 is conducted via a signal line 106 to the Receive Clock Qualification block 120 and the Receive Data Interpretor and Supervisor block 130. The IACP signal generated by flip-flop 118 is conducted via a signal line 108 to the Receive Data Interpretor and Supervisor block 130. The ST+ and ST− signals are conducted on lines 102 and 104 to an input carrier synchronizer portion 122 (450 on FIG. 7) of block 120 where the signals are individually synchronized through double buffering. The resulting signals are placed onto a clocked two-bit shift register 124 (460 on FIG. 7). The 2 clock-cycle delayed signals generated at the shift register output are passed to AND gates connected to the output of the shift register as are the double-buffered ST+ and ST− signals. The APS signal generated at the output of the AND gate 470 within circuit 124 is accordingly a HIGH the first time the line signal at the RxL0, RxL1 terminals of receiver 100 enters a carrier presence level after previously crossing the complementary presence level as shown in FIG. 4. The APS signal is conducted to an OR gate 125 (482 on FIG. 7) internal to block 120 which also receives the IACP signal conducted to block 120 via signal line 106 and the resulting output from OR gate 125 conducted to a carrier line change pulse width discriminator 126 (484 on FIG. 7) where it is used to reset a 5-bit counter within discriminator 126. The output of the counter is conducted to a complement input to an AND gate 128 (522 on FIG. 7) internal to block 120 and due to the feedback configuration of the counter provides a LOW at the complement input of gate 128 during the ¾ to 1¼ inter-bit interval of the input data. This "window" signal is gated with the APS signal conducted to a true input of the AND gate 128, thereby generating an advanced carrier sense ($\overline{\text{ACS}}$) signal.

A register 129 (472 on FIG. 7) internal to block 120 receives the $\overline{\text{IACP}}$ signal and the double-buffered ST+, ST− signals and supplies a third input to OR gate 125 which generates a HIGH signal when IACP is a LOW thereby resetting the counter 126 and ensuring that the first-generated ACS signal, the only one used, is correct.

The INPUT DATA signals generated by the differential zero-crossing detector 16 of receiver channel interface 10 are applied to an input data synchronizer portion 132 of the Receive Data Interpretor and Supervisor block 130 (610 on FIG. 9) of receiver 100. Data synchronizer 132 includes two buffering flip-flops 612 and 616 which receive the LINE INPUT DATA signals and synchronizes the signals with the internal clock applied to the flip-flops. The complement output of the second buffering flip-flop 616 ($\overline{\text{DAT0}}$) is received by a data zero-crossing detector portion 134 (622 on FIG. 9) of block 130. A one-internal-clock-delayed DAT0 signal (DAT1) generated by a third buffering flip-flop 618 within data synchronizer 132 is also received by the data zero-crossing detector 134 which comprises an exclusive-or (XOR) gate, the complement output of which generates the EDGE signal.

An OR gate 614 is connected to the input of the first buffering flip-flop of data synchronizer 132 and receives the $\overline{\text{IACP}}$ signal as well as the LINE INPUT DATA signals thereby ensuring that the $\overline{\text{EDGE}}$ signal is inactive whenever $\overline{\text{IACP}}$ is inactive.

The $\overline{\text{EDGE}}$ signal generated by data zero-crossing detector 134 as well as the uncomplemented EDGE signal is applied to a Receive Supervisor portion 136 (624 on FIG. 9) of block 130. The receive Supervisor also receives the $\overline{\text{IACP}}$ and ACS signals generated by the blocks 110 and 120, respectively. The Receive Supervisor 136 implements the three-state receive supervisor machine described above in connection with FIG. 5, above.

Initially, the receive supervisor 136 is OFF by virtue of $\overline{\text{IACP}}$ being inactive in that the IACP signal is received by a NOR gate 642 connected via an OR gate 630 to an internally-clocked state-control delay flip-flop 632 generating the Receive supervisor state 1 (RSUP1) signal. $\overline{\text{IACP}}$ is also received by an OR gate 638 connected to a second internally-clocked delay flip-flop 640 generating the receive supervisor state 0 ($\overline{\text{RSUP0}}$) signal. The OR gate 638 also receives the output of a latch 636 receiving the EDGE signal at its set input. The $\overline{\text{ACS}}$ signal is received at an OR gate 634 connected to the reset input of the latch 636. The RSUP1 signal is received at a second input to this OR gate and the RSUP0 signal is received at a second input to the NOR gate 642 connected via the OR gate 630 connected to the input of the flip-flop 630 generating RSUP1.

The result of these connections is that the 3-state machine remains in the OFF state "00" shown in FIG. 5, in that the output signals RSUP1, RSUP0, respectively, generated by the two delay flip-flops 630 and 640 within receive supervisor 136 are a LOW, LOW, respectively. Once the $\overline{\text{IACP}}$ signal generated by Receive Line Activity Counter 110 becomes active, the RSUP1 signal generated by the first delay flip-flop becomes a HIGH, thereby entering the ENABLE state "01" and permitting an active $\overline{\text{ACS}}$ signal to be latched through to the second delay flip flop. Thereupon the second delay flip-flop generates a HIGH RSUP0 signal upon the next occurrence of a HIGH EDGE signal. The resulting LOW $\overline{\text{RSUP0}}$ signal is applied to a third input of the NOR gate 642 connected to the first delay flip-flop via the OR gate 630 and causes the first delay flip-flop to generate a LOW RSUP1 signal. The receive supervisor 136 accordingly enters the FORCE state "10" and simultaneously generates a HIGH CRESET signal from the ouptut of the NOR gate 642.

The Receive Supervisor 136 receives the DPPLON signal generated by the Receive Decode Logic 140 block, as will be explained below, and this signal is applied to an OR gate 626, which also receives the IACP signal generated by the Receive Line Activity Counter 110. The output of this OR gate is conducted to the input of the first delay flip-flop 630 within the receive supervisor 136 and thereby permits the supervisor to return to the OFF "00" state from the FORCE "10" state only when no line activity is detected (IACP LOW) and the receiver 100 has effected logical external output signal completion (DPLLON LOW).

The CRESET signal generated by the NOR gate 642 within Receive Supervisor 136 is received by a third clocked delay flip-flop 648 which generates the $\overline{LA}$ signal, via a complement input to an AND gate 644, and an OR gate 646. A second input of the OR gate 646 receives the $\overline{IACP}$ signal generated by block 110. A second input of the AND gate 644 receives the output of an OR gate 650 receiving the output of the third delay flip-flop 648 and the end of message (EOM@¼) signal generated by a data ¼, ¾ cell sampler portion 138 (654 on FIG. 9) of block 130, as will now be explained.

The DAT0 signal generated by the input data synchronizer 132 is conducted to the data ¼, ¾ cell sampler 138 portion of block 130 which also receives the $\overline{DPLLON}$ signal generated by the Receive Decode Logic portion 140, as well as the ¼ and ¾ sampling signals generated by the Receive Clock recovery portion 150 of the Receiver 100. The operation and structure of the Receive clock recovery portion 150 is described in the related copending application, "A Method for Digital Clock Recovery from Manchester-encoded Signals", referred to at the outset of the instant application, and is hereby incorporated by reference. The DAT0 signal is sampled within the cell sampler 138 by a pair of latches 658 and 660 clocked by the ¼ and ¾ sampling signals, the output of which are supplied to a pair of delay flip flops 662 and 664 clocked by the internal clock generating a VAL and an OVAL signal, respectively. A Data Cell Status Decoder Portion 139 (668 on FIG. 9) receives the VAL and OVAL signals are applied to a NOR gate 678 within cell sampler 138 which generates a HIGH valid Manchester-encoded data/no fault (DATA/$\overline{FAULT}$) or at a complemented output a HIGH invalid Manchester-encoded, fault ($\overline{DATA/}$ FAULT) signal, in accordance with the presence of opposite logical polarity values of the VAL and OVAL signals, or equal logical polarity values, respectively. The EOM@¼ signal is also generated within cell sampler 138 by applying the VAL and OVAL signals and their complements generated by the delay flip-flops 662 and 664 within cell sampler 138 to a pair of OR gates 672 and 674 which are in turn connected to a NAND gate 670 the output of which is applied to a second OR gate 652. The latter OR gate also receiving the $\overline{IACP}$ and $\overline{LA}$ signals described above. The output of the latter OR gate is conducted to an AND gate 676 which also receives the ¼ sampling signal. The signal generated by the AND gate 676 being the EOM@¼ signal described above.

Since the Receive Clock Recovery portion 150 starts by generating ¾ signal HIGH initially, the $\overline{DPLLON}$ signal is applied to an AND gate 656 together with the ¾ signal, the output of the AND gate supplied to the S0 enable input of the latch 658 supplying the delay flip-flop generating the OVAL signal. In this way, since the DPLLON will be a HIGH signal during the subsequent ¼ sample, provided IACP is a HIGH, the $\overline{DPLLON}$ being HIGH forces an OVAL signal to be generated opposite to the polarity of the signal VAL generated by the delay flip flop 664 during the ¾ sample. Accordingly, the previous ¼ sample is forced to be valid during the sampling of the first Manchester cell after CRESET is set HIGH, within data ¼, ¾ cell sampler 138.

The Receive Decode Logic block 140 of receiver 100 receives the $\overline{VAL}$, EOM@¼, $\overline{DATA/FAULT}$ and DATA/$\overline{FAULT}$ signals generated by Receive Data Interpretor and Supervisor block 130 as well as the ¼ sample signal generated by Receive Clock Recovery block 150. In addition, an $\overline{IMODE}$ signal applied to a terminal of Receiver 100 is conducted to block 140. A HIGH, respectively, LOW IMODE signal selects the mode of operation of receiver 100 for decoding a message preceeded by either a 32-bit preamble, or no preamble, respectively.

A preamble detector portion 142 (700 on FIG. 10A) of receive decode logic block 140 receives the $\overline{IMODE}$ signal as well as the $\overline{VAL}$, EOM@¼ and DATA/$\overline{FAULT}$ and $\overline{DATA/FAULT}$ signals generated by block 130 and identifies the preamble when $\overline{IMODE}$ is a LOW and provides a three inter-bit delay when $\overline{IMODE}$ is a HIGH so that the minimum preamble is seven receive clock cycles in length, as required by certain SDLC MOS controllers to which the receiver 100 may be connected. A three inter-bit delay permits start-up faults to occur without aborting the entire message. A HIGH CP2 signal is generated by the preamble detector 142 if preamble has been detected and a HIGH CP1 signal is generated to indicate that the three inter-bit delay has occurred.

In either mode of operation, reception by preamble detector 142 of a HIGH EOM@¼ signal resets the detector. Accordingly, the preamble detector begins to examine the first DATA signals generated after a HIGH CRESET signal is generated by receive supervisor 136.

The CP1 signal is conducted to an external receive clock controller portion 144 (750 on FIG. 10B) of block 140 which also receives the $\overline{IMODE}$ signal and the ¼-sample signal. The external receive clock controller 144 generates a HIGH DPLLON signal on the reception of a HIGH ¼-sample signal following detection of the preamble after the HIGH CRESET signal is received by preamble detector 142 which accordingly generates a HIGH CP2 signal. In the case of $\overline{IMODE}$ LOW, when the CP1 signal received from preamble detector 142 becomes a HIGH DP1 signal is generated by clock controller 144 which is transmitted to an output snythesizer block 160 where it causes signals at the CP and RxC output terminals of receiver 100 to be generated. In the case of $\overline{IMODE}$ HIGH, a DP0 signal is immediately generated by clock controller 144 which is transmitted to block 160 and causes signals at the CP and RxC output terminals to be immediately generated.

Upon reception of the EOM@¼ signal, external clock controller 144 generates LOW DP0 and DP1 signals and the signals at the CP terminals are immediately extinguished, and the signal at the RxC terminal is extinguished on the following clock cycle, and the DPLLON signal is generated LOW by the clock controller 144.

A receiver data controller portion 146 (752 on FIG. 10B) of the receive decode logic block 140 receives the CP1 and CP2 signals generated by preamble detector 142 as well as the DATA/$\overline{FAULT}$ and $\overline{DATA/}$ FAULT signals generated within the block 130. A HIGH signal DC0 is generated by receive data controller 146 when either a CP1, CP2 or DATA/$\overline{FAULT}$ signal become HIGH. The HIGH DC0 signal is transmitted to block 160 and causes signals at the CS and RxD output terminals of receiver 100 to be generated. If a HIGH $\overline{DATA/FAULT}$ signal is subsequently received, the signal at the RxD output terminal continues but the signal at the CS output terminal is removed. If preamble was detected and preamble detector 142 generates a HIGH CP2 signal, but the first data signal after the preamble caused a HIGH $\overline{\text{DATA/FAULT}}$ signal to be generated, the signal at the RxD output terminal is activated, but the signal at the CS output terminal is removed after the first RxC cycle.

The output synthesizer block 160 receives the $\overline{\text{IACP}}$, DPPLON, $\frac{1}{4}$ sample, $\frac{3}{4}$ sample, DC0, DC1, $\overline{\text{DP0}}$, $\overline{\text{DP1}}$, $\overline{\text{VAL}}$ and $\overline{\text{DEN}}$ signals generated by the blocks 110, 120, 130, 140 and 150 as previously described. An advanced carrier presence synthesizer portion 162 (800 on FIG. 11) generates an $\overline{\text{IEACP}}$ signal from the $\overline{\text{IACP}}$, and DPLLON signals so that a HIGH $\overline{\text{IACP}}$ signal can generate a HIGH $\overline{\text{IEACP}}$ signal and LOW $\overline{\text{IACP}}$ and DPLLON signals cause a LOW $\overline{\text{IEACP}}$ signal to be generated.

An external receive clock and carrier presence synthesizer portion 164 (802 on FIG. 11) and a receive data and carrier sense synthesizer 166 (804 on FIG. 11) of block 160 are slaves of the external receive clock controller 144 and the receive data controller 146 portions of block 140 and produce internal $\overline{\text{ICP}}$ and $\overline{\text{ICS}}$ signals delayed by one internal clock cycle from the $\overline{\text{IRxC}}$ signal generated synthesizer 164 to provide necessary timing. The $\overline{\text{IRxC}}$ signal is formed by the $\frac{3}{4}$ sample signal to provide a rising edge and the $\frac{1}{4}$ sample signal to provide a falling edge. The $\overline{\text{IRxD}}$ signal is gated out by the $\frac{3}{4}$ sample signal.

We claim:

1. A method of detecting the presence of Manchester-encoded signals on a pair of signal lines, said Manchester-encoded signals being a serial Manchester-encoded bit stream having an inter-bit period T, comprising the steps of:
    (a) detecting "line activity", when a signed voltage differential on said pair of signal lines during a first voltage transition, exceeds a first predetermined positive reference voltage or falls below a second predetermined negative reference voltage; and
    (b) determining said detected line activity to be "Manchester-encoded" when said voltage differential exceeding said first predetermined reference voltage of said first voltage transition, during a second voltage transition, falls below said second predetermined reference voltage within a time-window of $\frac{3}{4} \times T$ to $1\frac{1}{4} \times T$ or when said voltage differential falling below said second predetermined reference voltage of said first voltage transition, during said second voltage transition, exceeds said first predetermined reference voltage within said time-window.

2. The decoding method of claim 1 wherein said line activity detection step (a) further calls for subsequently detecting "no line activity" when said signed voltage differential does not exceed said first predetermined reference voltage or exceeds said second predetermined reference voltage during two consecutive bit periods T and wherein said Manchester-encoded determination step (b) further calls for termination of said determination upon detection of "no line activity" in step (a).

3. A method of decoding Manchester-encoded signals received on a pair of signal lines and generating uncoded signals therefrom, said received Manchester-encoded signals being a serial Manchester-encoded bit stream having an inter-bit period T, including the steps (a) and (b) of detecting the presence of Manchester-encoded signals on said pair of signal lines according to the method of claim 1, further comprising the steps of:
    (c) detecting a "zero-crossing" of said received Manchester-encoded signals when said voltage differential on said pair of signal lines becomes zero immediately following the second voltage transition in said "Manchester-encoded" determination of step (b);
    (d) decoding of a sequence of validly-encoded ones of said received Manchester-encoded signals beginning at the $\frac{1}{4} \times T$ interval next-following said "zero-crossing" detection by sampling said signals at $\frac{1}{4} \times T$ and $\frac{3}{4} \times T$ intervals and decoding the present signal when the immediately-preceding signal has its $\frac{1}{4} \times T$ and $\frac{3}{4} \times T$ samples of opposite binary polarity with respect to each other; and
    (e) terminating said decoding when said immediately preceding $\frac{1}{4} \times T$ and $\frac{3}{4} \times T$ samples are of the same binary polarity with respect to each other and either the present $\frac{1}{4} \times T$ sample is of the same binary polarity, indicative of a logical end-of-message, or said present $\frac{1}{4} \times T$ is of the opposite binary polarity, indicative of an invalidly-encoded immediately-preceding signal.

4. The decoding method of claim 3 wherin decoding step (d) further calls for forcing said immediately-preceding $\frac{1}{4} \times T$ and $\frac{3}{4} \times T$ samples to opposite binary polarities with respect to each other during the decoding of the first signal received.

5. The decoding method of claim 3 wherein the $\frac{1}{4} \times T$, $\frac{3}{4} \times T$ and $1\frac{1}{4} \times t$ sampling called for in the Manchester-encoded determination steps (b) and (d) are measured by counting digital clock pulses from a digital clock having a pulse rate which is an integral multiple of the bit rate 1/T of the receive Manchester-encoded bit stream.

* * * * *